US012718864B2

(12) United States Patent
Han et al.

(10) Patent No.: US 12,718,864 B2
(45) Date of Patent: Aug. 25, 2026

(54) COMPUTING SYSTEM PERFORMING DUTY CYCLE ADJUSTER TRAINING AND DUTY CYCLE ADJUSTER TRAINING METHOD THEREOF

(71) Applicant: Samsung Electronics Co., Ltd., Suwon-si (KR)

(72) Inventors: Kideok Han, Suwon-si (KR); Ki-Seok Park, Suwon-si (KR); Young-Hoon Son, Suwon-si (KR); Do-Han Kim, Suwon-si (KR); Min-Su Bae, Suwon-si (KR); Yoenhwa Lee, Suwon-si (KR); Insu Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 180 days.

(21) Appl. No.: 18/529,283

(22) Filed: Dec. 5, 2023

(65) Prior Publication Data

US 2024/0321338 A1 Sep. 26, 2024

(30) Foreign Application Priority Data

Mar. 23, 2023 (KR) ........................ 10-2023-0037719
Jun. 12, 2023 (KR) ........................ 10-2023-0074798

(51) Int. Cl.
*G11C 11/4076* (2006.01)
*G11C 11/4096* (2006.01)

(52) U.S. Cl.
CPC ...... *G11C 11/4076* (2013.01); *G11C 11/4096* (2013.01)

(58) Field of Classification Search
CPC ........................ G11C 11/4076; G11C 11/4096
(Continued)

(56) References Cited

U.S. PATENT DOCUMENTS 7,590,173 B2 9/2009 Low et al.
9,312,868 B2 4/2016 Kim
(Continued)

FOREIGN PATENT DOCUMENTS

KR 100953459 B1 4/2010
KR 102140117 B1 8/2020
(Continued)

OTHER PUBLICATIONS

Extended European Search Report dated Aug. 7, 2024 for corresponding European Patent Application No. 24159824.2.

*Primary Examiner* — Alexander Sofocleous
*Assistant Examiner* — Duy H Luong
(74) *Attorney, Agent, or Firm* — HARNESS, DICKEY & PIERCE, P.L.C.

(57) ABSTRACT

A training method of a memory device adjusting an eye window of a data signal in response to a duty cycle adjuster (DCA) includes performing a first training operation that selects a first DCA code corresponding to a first internal clock signal having a phase difference of 180° relative to a reference internal clock signal, and performing a second training operation that selects a second DCA code and a third DCA code respectively corresponding to a second internal clock signal and a third internal clock signal having a phase difference of 90° and 270° relative to reference internal clock signal. In the first training operation, the eye window size of the data signal is measured in units of two unit intervals, and in the second training operation, the eye window size of the data signal is measured in units of one unit interval.

20 Claims, 17 Drawing Sheets

(58) Field of Classification Search
USPC ........................................................ 365/233.1
See application file for complete search history.

(56) References Cited

U.S. PATENT DOCUMENTS

| | | | |
|---|---|---|---|
| 10,367,493 B1 | 7/2019 | Addepalli et al. | |
| 11,003,370 B2 | 5/2021 | Kim et al. | |
| 11,228,416 B1 | 1/2022 | Huss et al. | |
| 2019/0081619 A1 | 3/2019 | Kim et al. | |
| 2021/0390991 A1* | 12/2021 | Kumar | G11C 7/1066 |
| 2023/0029968 A1 | 2/2023 | Chang et al. | |

FOREIGN PATENT DOCUMENTS

| | | |
|---|---|---|
| KR | 102327498 B1 | 11/2021 |
| KR | 10-2023-0019596 A | 2/2023 |

* cited by examiner

1300
Cell Array
Sense Amplifier
1310
1315
I/O SA
1380
CLK Generation Circuit
1360
ADDR DEC
1320
CMD DEC
1330
MRS
DCA Code
1340
1345
DCA
1350
I/O Circuit
1370
ICLK
QCLK
IBCLK
QBCLK
DQS
Dout
CMD/ADDR
CK_t/CK_c
DQ

FIG. 4

Start

S110

Check DCA Assist mode

S120

DCA Training for IBCLK

S130

DCA training for QCLK & QBCLK

End

S120
Start
Set IBCLK DCA value
S121
Get read timing margin of
Even_UI+Odd_UI
S122
Last case ?
S123
Yes
No
Select next
DCA case
S124
Generate score for each
DCA cases
S125
Select optimal DCA value of
IBCLK
S126
Set IBCLK DCA code
S127
S120
End 1100
Memory Controller
1300
Memory Device
1st loop
255th loop
QCLK DCA code write(131a)
QBCLK DCA code write(132a)
Output data pattern
S133a
Get read timing margin
QCLK DCA code write(131b)
QBCLK DCA code write(132b)
Output pattern
S133b
Get read timing margin
S136
Get score for each DCA cases
S137
Select optimal QCLK/QBCLK DCA value
(S138) Set QCLK/QBCLK DCA code

FIG. 13A

Raw score
(1610)

| Read Timing margin(EW) | | QCLK | | | | | | | | | | | | | | |
|---|---|---|---|---|---|---|---|---|---|---|---|---|---|---|---|---|
| | | -7 | -6 | -5 | -4 | -3 | -2 | -1 | 0 | 1 | 2 | 3 | 4 | 5 | 6 | 7 |
| QBCLK | -7 | 40 | 41 | 42 | 42 | 42 | 40 | 40 | 40 | 39 | 37 | 36 | 32 | 27 | 23 | 20 |
| | -6 | 40 | 41 | 42 | 42 | 42 | 43 | 42 | 40 | 39 | 38 | 37 | 33 | 28 | 23 | 20 |
| | -5 | 40 | 41 | 41 | 43 | 42 | 42 | 42 | 42 | 41 | 40 | 37 | 34 | 28 | 24 | 21 |
| | -4 | 41 | 41 | 42 | 41 | 43 | 43 | 45 | 43 | 42 | 40 | 38 | 35 | 30 | 25 | 21 |
| | -3 | 40 | 41 | 42 | 42 | 42 | 43 | 44 | 42 | 44 | 41 | 38 | 36 | 31 | 26 | 22 |
| | -2 | 40 | 41 | 41 | 42 | 42 | 43 | 45 | 44 | 43 | 42 | 40 | 36 | 32 | 36 | 21 |
| | -1 | 39 | 40 | 42 | 42 | 42 | 44 | 43 | 45 | 43 | 43 | 40 | 36 | 33 | 27 | 22 |
| | 0 | 39 | 40 | 41 | 42 | 43 | 43 | 44 | 45 | 44 | 43 | 41 | 37 | 31 | 30 | 23 |
| | 1 | 37 | 39 | 40 | 42 | 43 | 43 | 44 | 45 | 44 | 43 | 40 | 38 | 35 | 29 | 23 |
| | 2 | 38 | 39 | 40 | 41 | 42 | 44 | 44 | 44 | 44 | 43 | 41 | 39 | 35 | 30 | 26 |
| | 3 | 37 | 37 | 39 | 40 | 42 | 43 | 43 | 44 | 44 | 44 | 42 | 39 | 36 | 31 | 27 |
| | 4 | 35 | 36 | 37 | 39 | 41 | 41 | 41 | 43 | 42 | 43 | 42 | 41 | 36 | 33 | 28 |
| | 5 | 33 | 35 | 37 | 38 | 40 | 40 | 41 | 41 | 42 | 42 | 41 | 41 | 38 | 33 | 28 |
| | 6 | 31 | 33 | 33 | 35 | 36 | 38 | 37 | 39 | 40 | 41 | 41 | 40 | 38 | 35 | 31 |
| | 7 | 29 | 29 | 29 | 31 | 33 | 33 | 36 | 35 | 35 | 39 | 38 | 39 | 38 | 35 | 32 |

FIG. 13B

Combinational score (1620)

| EW Score | | QCLK | | | | | | | | | | | | | | |
|---|---|---|---|---|---|---|---|---|---|---|---|---|---|---|---|---|
| | | -7 | -6 | -5 | -4 | -3 | -2 | -1 | 0 | 1 | 2 | 3 | 4 | 5 | 6 | 7 |
| QBCLK | -7 | 241 | 246 | 251 | 252 | 250 | 245 | 242 | 239 | 233 | 224 | 214 | 192 | 164 | 139 | 123 |
| | -6 | 241 | 246 | 250 | 253 | 253 | 252 | 249 | 243 | 236 | 229 | 218 | 197 | 167 | 141 | 124 |
| | -5 | 242 | 245 | 250 | 252 | 254 | 254 | 255 | 250 | 245 | 236 | 223 | 201 | 172 | 145 | 128 |
| | -4 | 244 | 247 | 249 | 252 | 254 | 259 | 262 | 257 | 252 | 241 | 226 | 208 | 179 | 151 | 131 |
| | -3 | 242 | 246 | 250 | 251 | 254 | 258 | 263 | 259 | 256 | 246 | 231 | 212 | 168 | 156 | 134 |
| | -2 | 240 | 244 | 249 | 251 | 253 | 260 | 264 | 263 | 259 | 251 | 236 | 216 | 190 | 158 | 133 |
| | -1 | 236 | 242 | 248 | 252 | 255 | 259 | 264 | 265 | 261 | 254 | 240 | 218 | 192 | 165 | 137 |
| | 0 | 233 | 239 | 246 | 252 | 256 | 260 | 263 | 268 | 263 | 257 | 242 | 220 | 197 | 170 | 144 |
| | 1 | 227 | 234 | 242 | 250 | 256 | 260 | 264 | 267 | 264 | 256 | 243 | 227 | 203 | 176 | 147 |
| | 2 | 227 | 232 | 239 | 246 | 254 | 260 | 263 | 265 | 263 | 258 | 246 | 231 | 210 | 181 | 158 |
| | 3 | 221 | 225 | 232 | 241 | 250 | 256 | 258 | 262 | 262 | 260 | 250 | 236 | 213 | 188 | 166 |
| | 4 | 211 | 216 | 225 | 234 | 244 | 247 | 250 | 254 | 256 | 256 | 251 | 240 | 220 | 194 | 172 |
| | 5 | 200 | 209 | 217 | 227 | 235 | 240 | 241 | 247 | 249 | 251 | 248 | 242 | 224 | 200 | 176 |
| | 6 | 188 | 194 | 200 | 208 | 218 | 222 | 228 | 231 | 237 | 244 | 242 | 239 | 227 | 207 | 188 |
| | 7 | 176 | 178 | 180 | 190 | 199 | 206 | 213 | 215 | 219 | 231 | 233 | 233 | 226 | 210 | 194 |

Select

Figure 14:
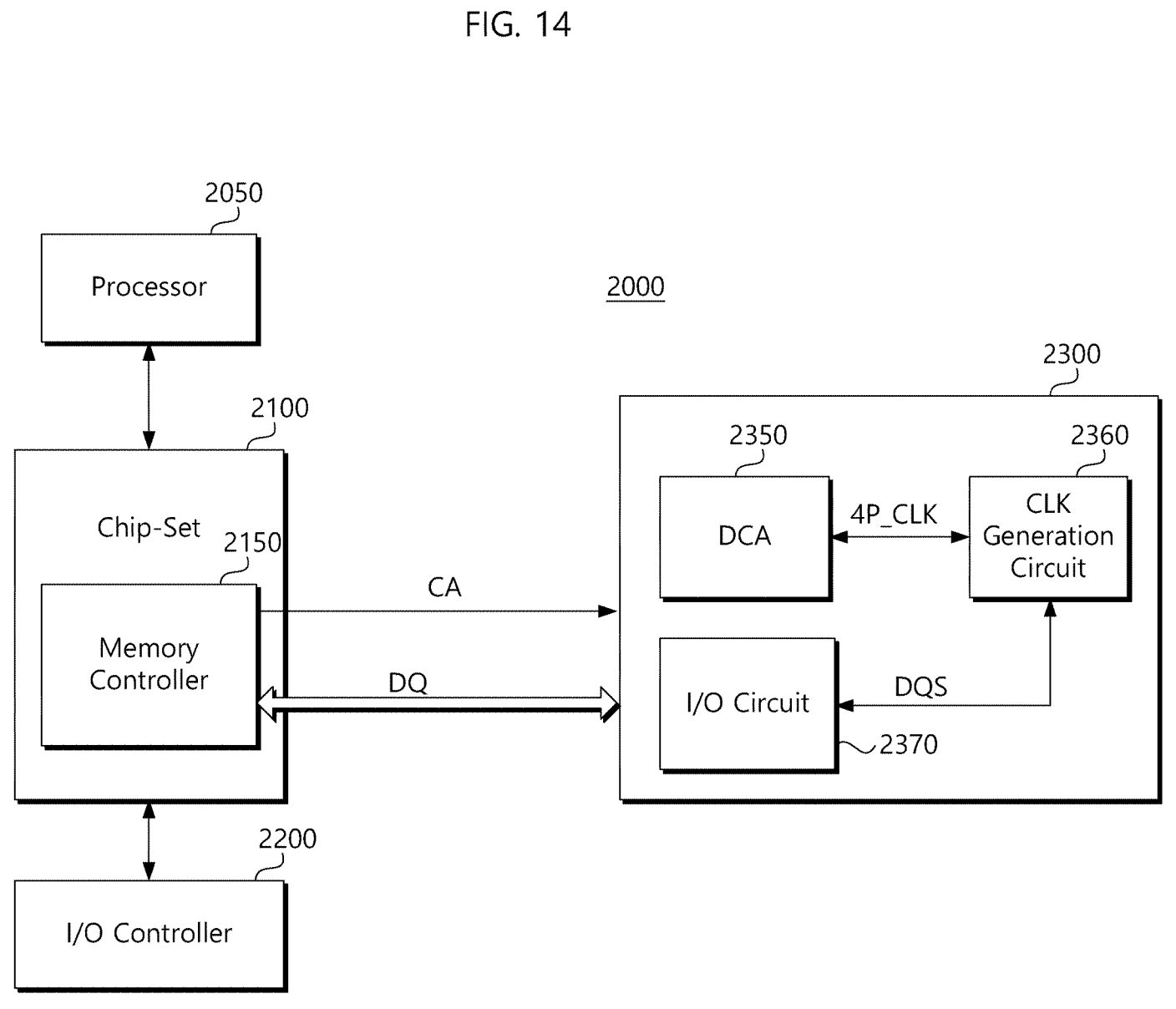

2300
2360
CLK Generation Circuit
4P_CLK
DQS
2350
DCA
2370
I/O Circuit
CA
DQ
2050
Processor
2100
Chip-Set
2150
Memory Controller
2200
I/O Controller

COMPUTING SYSTEM PERFORMING DUTY CYCLE ADJUSTER TRAINING AND DUTY CYCLE ADJUSTER TRAINING METHOD THEREOF

CROSS-REFERENCE TO RELATED APPLICATIONS

This application claims priority under 35 U.S.C. § 119 to Korean Patent Application No. 10-2023-0037719 filed on Mar. 23, 2023, and to Korean Patent Application No. 10-2023-0074798 filed on Jun. 12, 2023 in the Korean Intellectual Property Office, the disclosures of each of which are incorporated by reference herein in their entireties.

BACKGROUND

Various example embodiments described herein relates to a semiconductor memory device, and more particularly, to a computing system including a memory device trained by adjusting a duty cycle adjuster (DCA) code, and/or a DCA training method thereof.

Recently, various mobile devices and/or other electronic devices such as smart phones, desktop computers, laptop computers, tablet PCs, and wearable devices are widely used. These electronic devices usually include semiconductor memory devices for storing data. As an example of a semiconductor memory device, a dynamic random access memory DRAM device, which is a volatile-memory, stores data by charge stored in a capacitor.

As an input/output speed of a memory device increases, the signal integrity (SI) characteristic of a data signal (DQ) input at high speed is relatively deteriorated. One approach to solve or improve the problem of signal integrity is a training method using a duty cycle adjuster) DCA). Through DCA training, the read margin of the data signal DQ and/or data strobe signal DQS can be increased by adjusting the internal clock of the memory device using the DCA code.

However, too much time delay may occur in order to set a good or an optimal duty cycle through such DCA training. Alternatively or additionally, when a command even gap is not observed, application of the DCA code may fail.

SUMMARY

Various example embodiments provides a memory device, a computing system, and/or a DCA training method thereof to which DCA training capable of providing a high read margin can be applied.

According to various example embodiments, a training method of a memory device adjusting an eye window of a data signal in response to a duty cycle adjuster (DCA) code includes performing a first training operation that selects a first DCA code corresponding to a first internal clock signal having a phase difference of 180° relative to a reference internal clock signal, and performing a second training operation for selecting a second DCA code and a third DCA code respectively corresponding to a second internal clock signal and a third internal clock signal having a phase difference of 90° and 270° relative to the reference internal clock signal. In the first training operation, the eye window size of the data signal is measured in units of two unit intervals, and in the second training operation, the eye window size of the data signal is measured in units of one unit interval.

Alternatively or additionally according to various example embodiments, a computing system configured to adjust a duty cycle of four mutually orthogonal internal clock signals through a duty cycle adjuster (DCA) code includes a memory device configured to generate a data signal or a data strobe signal having a changed duty cycle in response to a code value of the DCA code, and a memory controller configured to perform a first training that selects a first DCA code corresponding to a first internal clock signal having a phase difference of 180° relative to a reference internal clock signal, and to perform a second training operation that selects a second DCA code and a third DCA code respectively corresponding to a second internal clock signal and a third internal clock signal having a phase difference of 90° and 270° relative to the reference internal clock signal. The memory controller is configured to generate a score by measuring an eye window size in units of two unit intervals of the data signal output from the memory device during the first DCA training.

Alternatively or additionally according to various example embodiments, a training method of a memory device for adjusting the characteristics of a data signal and/or a data strobe signal by receiving a duty cycle adjuster DCA code includes performing a first training of writing a code to select a first DCA code corresponding to a first internal clock signal IBCLK and selecting a code by measuring an eye window size of an output data signal, and performing a second training of writing a combination code to select a combination code of a second DCA code and a third DCA code respectively corresponding to the second internal clock signal QCLK and the third internal clock signal QBCLK and measuring an eye window size of the output data signal. In the first training, the eye window size of the data signal is measured in units of two unit intervals.

BRIEF DESCRIPTION OF THE FIGURES

The above and other objects and features will become apparent by describing in detail example embodiments thereof with reference to the accompanying drawings.

FIG. 4 is a flowchart showing a DCA training method according to an embodiment of the present invention.

FIG. 13A and FIG. 13B are tables showing a method of generating scores for each DCA code according to DCA sweep of the second and fourth internal clock signals QCLK and QBCLK.

FIG. 14 is a block diagram showing a computing system according to some example embodiments.

DETAILED DESCRIPTION

It is to be understood that both the foregoing general description and the following detailed description are examples only, and it is to be considered that an additional description is provided. Reference signs are indicated in detail in various embodiments, examples of which are indicated in the reference drawings. Wherever possible, the same reference numbers are used in the description and drawings to refer to the same or like parts.

Hereinafter, DRAM will be used as an example of a semiconductor memory device for explaining the features and/or functions of various inventive concepts. However, those of ordinary skill in the art will readily appreciate other advantages and capabilities of example embodiments in light of the teachings herein. Example embodiments may be implemented or applied through other embodiments. In addition, the detailed description may be modified and/or changed according to viewpoints and applications without significantly departing from the scope, spirit, and other objectives of inventive concepts.

Figure 1:
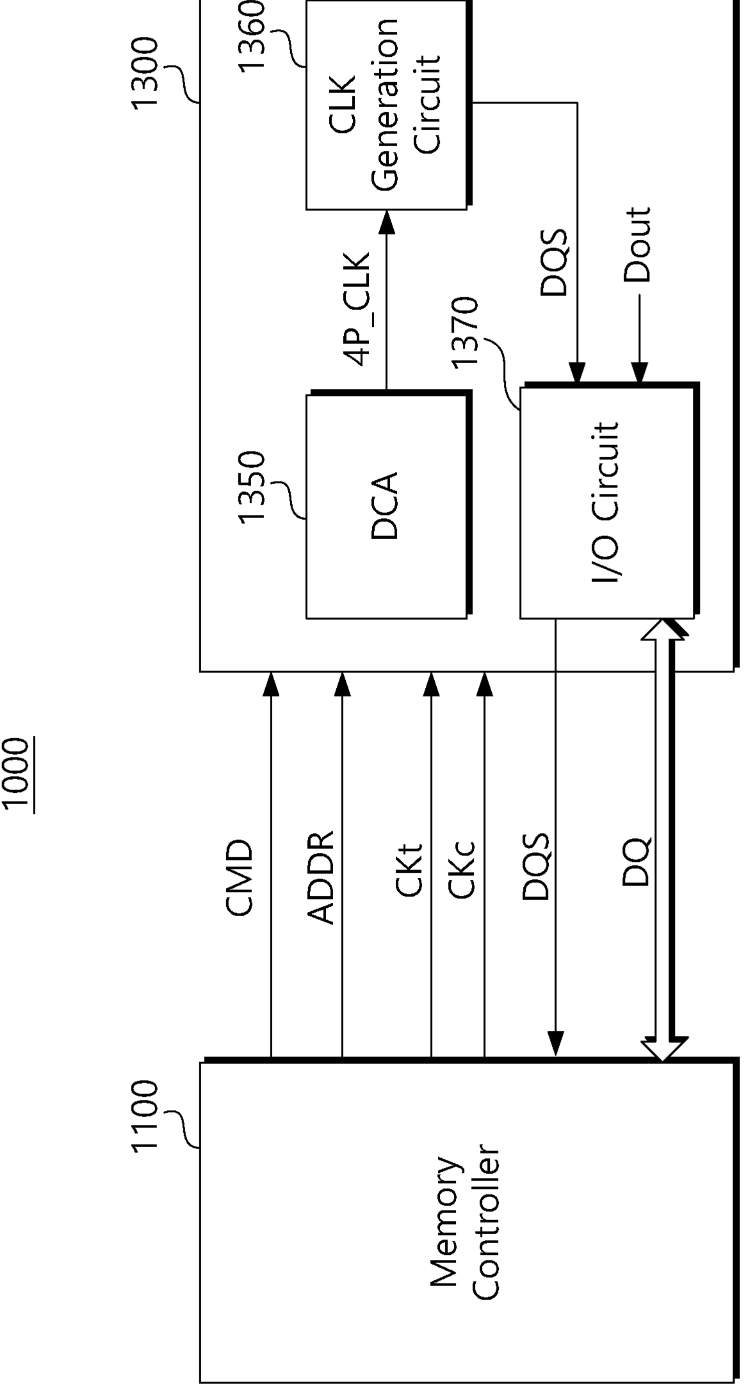
FIG. 1 is a block diagram showing the structure of a memory system according to various example embodiments.

FIG. 1 is a block diagram showing the structure of a memory system according to various example embodiments. Referring to FIG. 1, a memory system 1000 includes a memory controller 1100 and a memory device 1300. The memory controller 1100 performs duty cycle adjuster DCA training of the memory device 1300 so as to adjust the duty cycle (or duty ratio) of the data signal DQ or data strobe signal DQS. The DCA training may be applied, for example, when booting and/or when initializing the memory system 1000, but the application time of the DCA training is not limited to the disclosure herein.

The memory controller 1100 may perform an access operation of writing data to the memory device 1300 and/or of reading data stored in the memory device 1300. The memory controller 1100 may generate clock signals CKt and CKc, a command CMD, and an address ADDR for writing data into the memory device 1300 and/or for reading data stored in the memory device 1300. The memory controller 1100 may be at least one of a chipset for controlling the memory device 1300, a system on chip SoC such as a mobile application processor AP, a CPU, and a GPU.

In particular, the memory controller 1100 may adjust the duty cycle of the data signal DQ and/or of the data strobe signal DQS that are output from the memory device 1300 through DCA training. The memory device 1300 generates internal clocks (e.g., ICLK, QCLK, IBCLK, and QBCLK) of four phases whose duty cycles are adjusted according to the DCA code. The sizes of the eye windows of the data strobe signal DQS and the data signal DQ of the memory device 1300 are adjusted by adjusting the duty cycles of the four-phase internal clocks ICLK, QCLK, IBCLK, and QBCLK. For example, the memory controller 1100 may adjust the duty cycles of the internal clocks ICLK, QCLK, IBCLK, and QBCLK of the memory device 1300 by adjusting the DCA code. In some example embodiments, the signal integrity (SI) characteristics of the data strobe signal DQS and the data signal DQ output from the memory device 1300 can be adjusted. Adjustment of the duty cycle of the four phase internal clocks ICLK, QCLK, IBCLK, and QBCLK may be a factor that determines the eye window size and/or signal integrity of the data signal DQ.

The memory controller 1100 can adjust the duty cycle for each phase with high accuracy by sequentially adjusting the internal clock signals ICLK, QCLK, IBCLK, and QBCLK through DCA training of the memory device 1300. Alternatively or additionally, when the internal clock signal (e.g., IBCLK) is first trained, the eye window size of two unit intervals (hereinafter referred to as UI) of the data signal DQ to be output is measured. A score for each DCA code may be generated based on the measured eye window size. The duty cycle of the internal clock IBCLK is determined by selecting a DCA code corresponding to the maximum value among the generated scores. Therefore, there is no or a limited possibility of inter-phase DCA codes being mixed even if a command even gap, in which the order of even/odd unit intervals is important, is not observed. Alternatively or additionally, the memory controller 1100 uses a random training pattern to enable DCA training in an environment closer to a highly practical use environment.

The memory device 1300 may perform DCA training according to DCA code writing by the memory controller 1100. The memory device 1300 generates a 4-phase internal clock 4P_CLK whose duty cycle is adjusted according to the DCA code written by the memory controller 1100. The 4-phase internal clock 4P_CLK may be internal clock signals ICLK, QCLK, IBCLK, and QBCLK each having a phase difference of 90°. In some example embodiments, one internal clock signal (e.g., ICLK) may have a fixed duty cycle. Additionally or alternatively, the duty cycle of the remaining three internal clock signals (e.g., QCLK, IBCLK, QBCLK) can be adjusted using the DCA code. For these features, the memory device 1300 may include a duty cycle adjuster 1350, a clock generator 1360, and an input/output circuit 1370.

The duty cycle adjuster 1350 generates a 4-phase internal clock signal 4P_CLK whose duty cycle is adjusted according to the DCA code written by the memory controller 1100. The 4-phase internal clock signal 4P_CLK may be generated based on clock signals CKt and CKc and/or on write clock signals WCKt and WCKc provided from the memory controller 1100. In general, the first internal clock signal ICLK may be a fixed internal clock signal whose duty cycle is not adjusted with a DCA code. On the other hand, the second internal clock signal QCLK has a phase difference of 90° from or relative to the first internal clock signal ICLK, the third internal clock signal IBCLK has a phase difference of 180° from or relative to the first internal clock signal ICLK, and the fourth internal clock signal QBCLK has a phase difference of 270° from the first internal clock signal ICLK. The duty cycle adjuster 1350 may adjust the duty cycles of the second to fourth internal clock signals according to the written DCA code.

The clock generator circuit 1360 generates a clock signal and/or data strobe signal DQS according to the 4-phase internal clock 4P_CLK provided from the duty cycle adjuster 1350. The clock generator circuit 1360 may increase and/or decrease the even clock duty cycle ratio of the data strobe signal DQS according to the second internal clock QCLK having an increased or decreased duty cycle. Similarly, the clock generator circuit 1360 may increase and/or decrease the even clock duty ratio or the odd clock duty ratio of the data strobe signal DQS according to the third internal clock IBCLK or the fourth internal clock QBCLK having an increased or decreased duty cycle.

The input/output circuit 1370 outputs the read data Dout as the data signal DQ by using the clock signal or the data strobe signal DQS provided from the clock generator circuit 1360. The data signal DQ is transmitted to the memory controller 1100 in synchronization with the data strobe signal DQS generated by the clock generator 1360.

The memory device 1300 may be implemented as a volatile memory device. The volatile memory device may be implemented as or may include or be included in at least one of random access memory RAM, dynamic RAM (DRAM), or static RAM (SRAM), but is not limited thereto. For example, the memory device 1300 may correspond to or may include one or more of Double Data Rate Synchronous Dynamic Random Access Memory (DDR SDRAM), Low Power Double Data Rate (LPDDR) SDRAM, Graphics Double Data Rate (GDDR) SDRAM, Rambus Dynamic Random Access Memory (RDRAM), and the like. Alternatively or additionally, the memory device 1300 may be implemented as or may include or be included in a high bandwidth memory HBM.

The memory system 1000 may be implemented to be included in a personal computer PC and/or mobile device. Mobile devices include laptop computers, mobile phones, smartphones, tablet PC, personal digital assistants PDA, enterprise digital assistants EDA, digital still cameras, digital video cameras, portable multimedia players PMP, personal navigation devices or portable navigation devices PND, handheld game consoles, mobile Internet devices MID, wearable computers, Internet of Things IoT devices, Internet of Everything IoE, or a drone.

Figure 2:
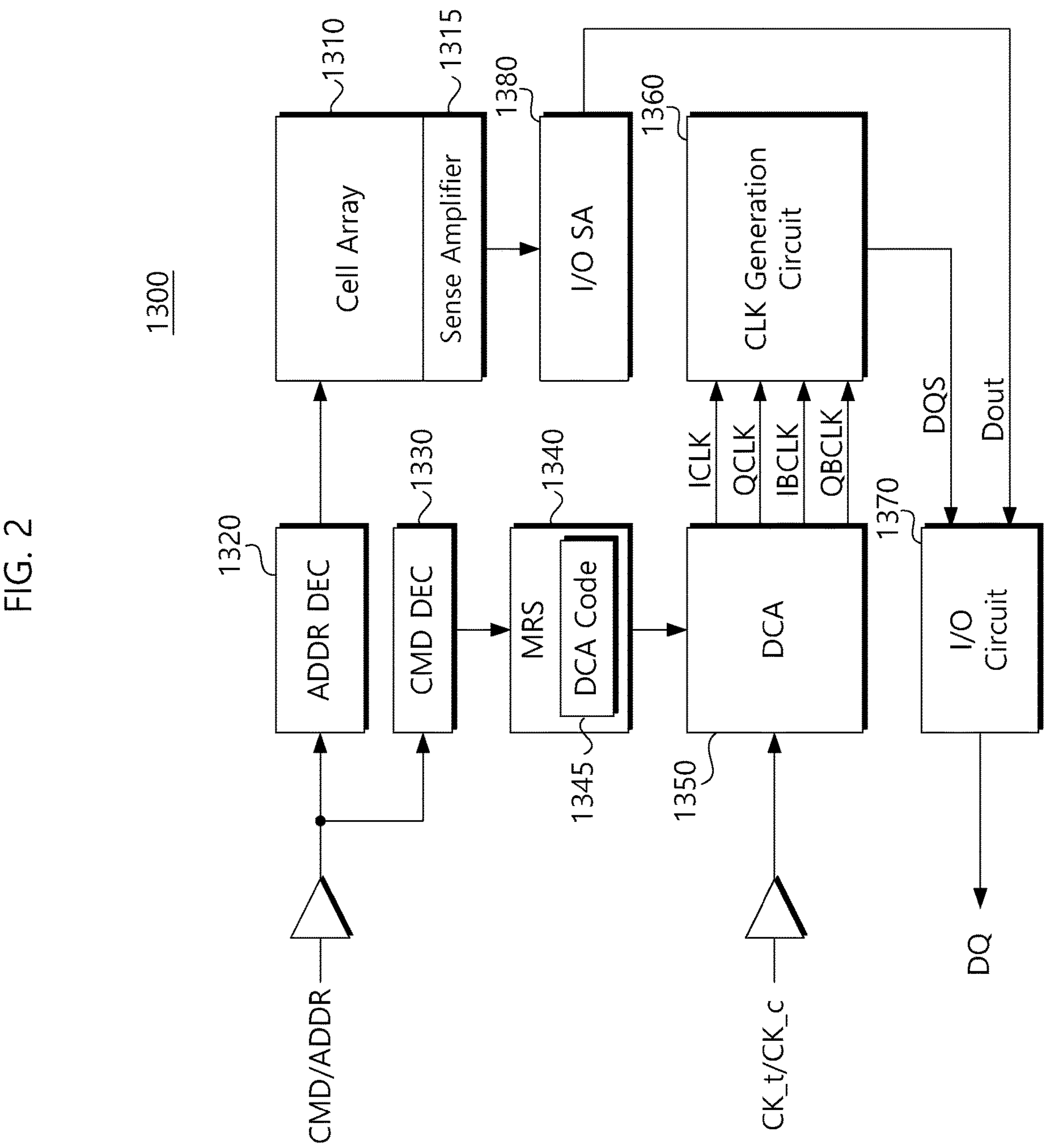
FIG. 2 is a block diagram illustrating the memory device of FIG. 1.

FIG. 2 is a block diagram illustrating the memory device of FIG. 1. Referring to FIG. 2, a memory device 1300 may include a cell array 1310, a sense amplifier 1315, an address decoder 1320, a command decoder 1330, a mode register set 1340, a duty cycle adjuster 1350, a clock generation circuit 1360, an input/output circuit 1370, and an input/output sense amplifier 1380.

The cell array 1310 includes a plurality of memory cells. Write data received through the input/output sense amplifier 1380 may be written into the plurality of memory cells by the sense amplifier 1315. Other components such as but not limited to row drivers (not shown) and/or redundancy analysis engines (not shown) may be included; example embodiments are not limited thereto. Data written in the memory cell is selected by the command CMD and address ADDR of the memory controller 1100 and sensed by the sense amplifier 1315. Data sensed by the sense amplifier 1315 may be transferred to the input/output sense amplifier 1380 and then to the input/output circuit 1370.

The address decoder 1320 receives the address ADDR of the memory cell to be accessed. When data is stored in the memory cell and/or when data is read from the memory cell, the address ADDR may be transmitted to the cell array 1310 as row address and column address through the address decoder 1320.

The command decoder 1330 may access a mode register set MRS 1340 for setting various modes and/or operations of the memory device 1300. The command decoder 1330 may identify attributes of an input command by referring to externally applied signals (e.g., one or more of row address strobes /RAS, column address strobes /CAS, write enable /WE). For example, a general auto refresh operation is input through a combination of control signals (/RAS, /CAS, /WE). Then, a refresh operation for the cell array 1310 may be triggered by the command decoder 1330. In addition, the command decoder 1330 may write data into the mode register set 1340 according to an externally provided command and address. For example, DCA codes provided for DCA training of example embodiments are written to the mode register set 1340 by the command decoder 1330.

The mode register set 1340 sets internal mode registers in response to an MRS command and address ADDR for designating an operation mode of the memory device 1300. The mode register set 1340 of example embodiments may include a DCA code register 1345 in which the DCA code for adjusting the duty cycle of the data signal DQ and/or the data strobe signal DQS is written. A mode register write MRW command may be used to write the DCA code into the DCA code register 1345. The DCA code for adjusting the duty cycle of each of the internal clock signals QCLK, IBCLK, and QBCLK is written into the DCA code register 1345. The DCA code may be written in units of multiple steps for decreasing or increasing the duty cycle of the internal clock signal in the '−7 to +7' DCA range. For example, if the current DCA code of the second internal clock signal QCLK is a '−7' step, the DCA code of the second internal clock signal QCLK can be written as a '−5' step so as to increase the duty cycle of the data strobe signal DQS. In order to decrease the duty cycle, the DCA code value of a step lower than the current DCA code may be written to the DCA code register 1345. In general, the DCA code register 1345 is set so that the first internal clock signal ICLK cannot be adjusted and the second to fourth internal clock signals QCLK, IBCLK, and QBCLK can be adjusted. However, the range of adjustable internal clock signals is not limited thereto.

The duty cycle adjuster 1350 generates internal clock signals ICLK, QCLK, IBCLK, and QBCLK according to the DCA code written to the mode register set 1340. The duty cycle adjuster 1350 generates internal clock signals ICLK, QCLK, IBCLK, and QBCLK using externally provided clock signals CK_t and CK_c or write clock signals WCK_t and WCK_c.

The clock generator circuit 1360 generates a clock signal and/or a data strobe signal DQS from the internal clock signals ICLK, QCLK, IBCLK, and QBCLK provided from the duty cycle adjuster 1350. The clock generator circuit 1360 may increase and/or decrease the even clock duty cycle ratio of the data strobe signal DQS according to the second internal clock QCLK having an increased or decreased duty cycle. Similarly, the clock generator circuit 1360 may increase and/or decrease the even clock duty ratio or the odd clock duty ratio of the data strobe signal DQS according to the third internal clock IBCLK or the fourth internal clock QBCLK having an increased or decreased duty cycle.

The input/output circuit 1370 outputs the read data Dout as the data signal DQ by using the clock signal or the data strobe signal DQS provided from the clock generator circuit 1360. The data signal DQ is transmitted to the memory controller 1100 in synchronization with the data strobe signal DQS generated by the clock generator 1360.

Alternatively or additionally in some example embodiments, the memory cell included in the cell array 1310 may be or may include a non-volatile memory cell, and the memory device 1300 includes non-volatile memory such as one or more of an electrically erasable programmable read-only memory EEPROM, flash memory, phase change random access memory PRAM, resistance random access memory RRAM, nano floating gate memory NFGM, and polymer random access memory PoRAM, magnetic random access memory MRAM, ferroelectric random access memory FRAM, and the like. Hereinafter, the memory device 1300 is described as the DRAM, but it will be well understood that the technical spirit of example embodiments is not limited thereto.

As described above, the memory device 1300 may be set to a DCA code that increases, e.g., that maximizes the eye window of the data signal DQ through DCA training.

Figure 3:
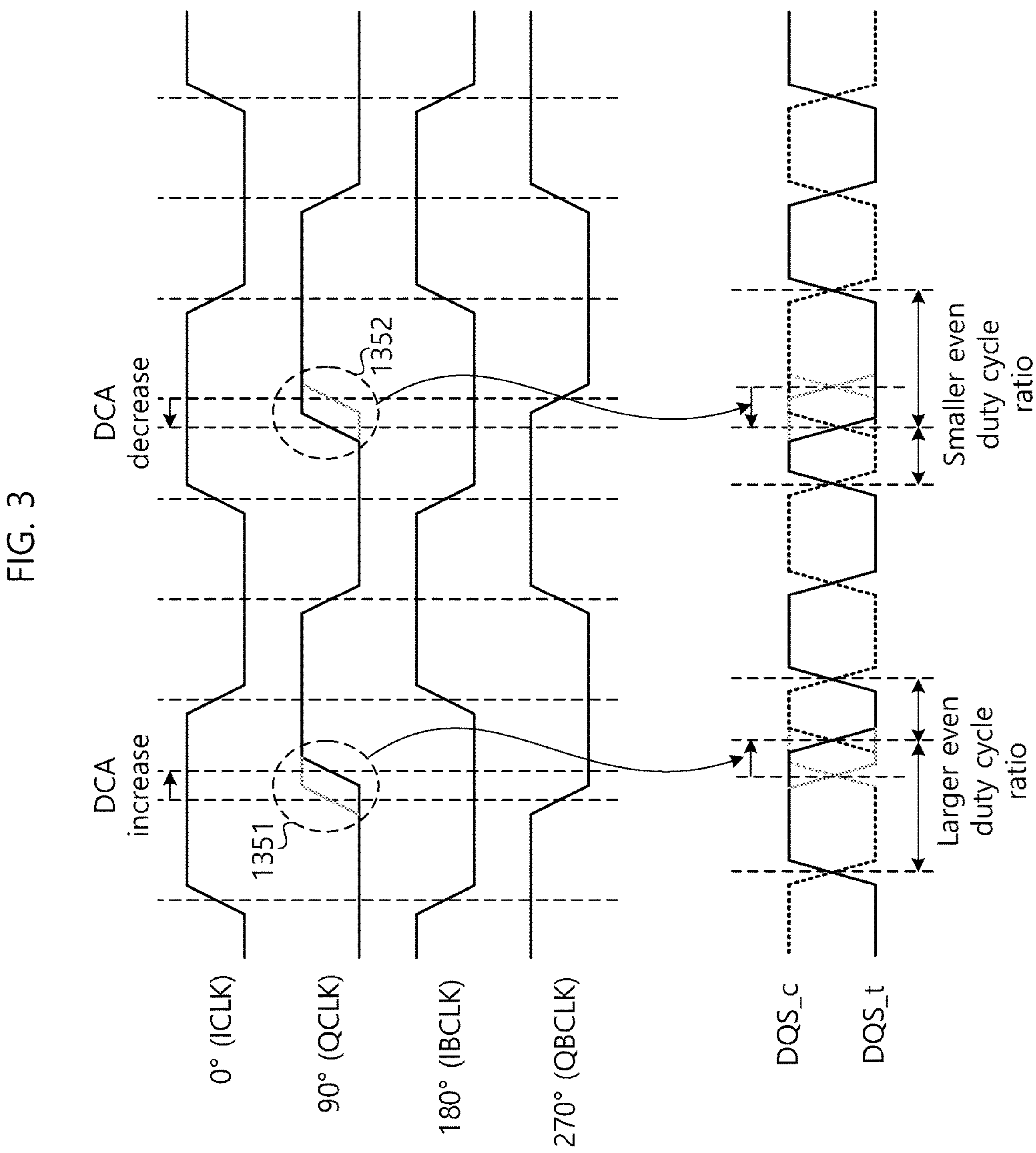
FIG. 3 is a timing diagram exemplarily illustrating a change in duty cycle of a data strobe signal according to DCA code adjustment.

FIG. 3 is a timing diagram exemplarily illustrating a change in duty cycle of a data strobe signal according to DCA code adjustment. Referring to FIG. 3, a change in the data strobe signal DQS when the DCA code of the second internal clock signal QCLK is increased or decreased among four phase internal clock signals ICLK, QCLK, IBCLK, and QBCLK is shown.

The second internal clock signal QCLK has a 90° phase difference with the first internal clock signal ICLK. It may be assumed that the DCA code corresponding to the currently written second internal clock signal QCLK is in a '0' step state. Further, when the DCA code is increased by '+2' steps through DCA code writing, the rising edge of the second internal clock signal QCLK retreats as indicated by the dotted line circle 1351. The retraction of the rising edge of the second internal clock signal QCLK increases the magnitude of the even duty cycle period of the data strobe signal DQS. On the other hand, when the DCA code is decreased by '−2' steps through writing the DCA code, the rising edge of the second internal clock signal QCLK advances like the dotted line circle 1352. The advancing rising edge of the second internal clock signal QCLK reduces the magnitude of the even duty cycle period of the data strobe signal DQS.

In the above, the writing effect of the DCA code for adjusting the second internal clock signal QCLK among the internal clock signals ICLK, QCLK, IBCLK, and QBCLK has been briefly described. Similarly, the size of the duty cycle period of the data strobe signal DQS can be adjusted by adjusting the DCA code of the third to fourth internal clock signals IBCLK and QBCLK.

Figure 4:
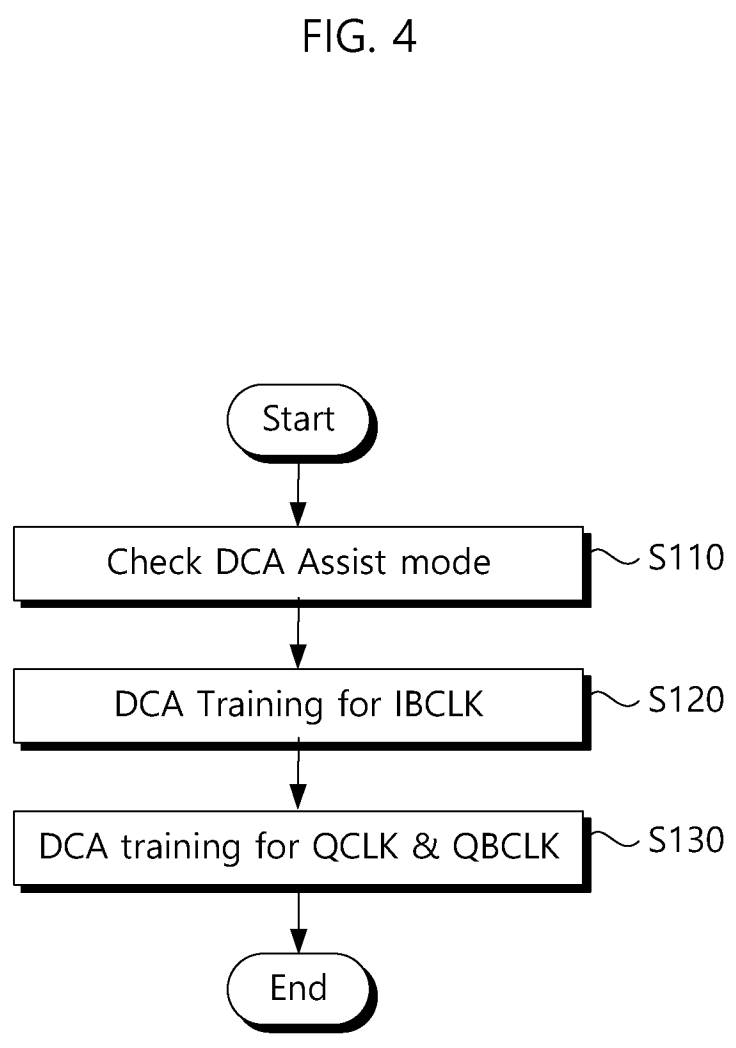

FIG. 4 is a flowchart showing a DCA training method according to some example embodiments. Referring to FIG. 4, the memory system 1000 (referring to FIG. 1) of various example embodiments performs DCA training on the third internal clock IBCLK, and then sequentially performs DCA training on the second and fourth internal clocks (QCLK, QBCLK). In particular, the size of the eye window is measured in units of two unit intervals UI to calculate a score during training of the third internal clock IBCLK. In some example embodiments, the size of the eye window is measured to be one unit intervals UI so as to calculate a score during training of the second and fourth internal clocks (QCLK, QBCLK).

In operation S110, the memory controller 1100 checks whether the DCA support mode exists in the memory device 1300. This may be because memory devices prior to a specific generation may not support DCA training. At this time, whether the internal clock signals ICLK, QCLK, IBCLK, and QBCLK are synchronized may also be checked. For example, the memory controller 110 may check as to whether the internal clock signals ICLK and IBCLK maintain a phase difference of 180°.

In operation S120, the memory controller 1100 performs DCA training on the third internal clock signal IBCLK of the memory device 1300. DCA training of the third internal clock signal IBCLK is or includes as follows. First, the memory controller 1100 sweeps the data signal DQ while changing the DCA code of the third internal clock signal IBCLK of the memory device 1300. For example, the memory controller 1100 writes the DCA code of the third internal clock signal IBCLK into the memory device 1300 from '−7' step to '+7' step, and measures the eye window size of the output data signal DQ at every step.

Here, the DCA sweep refers to an input/output operation for measuring the eye window size of the data signal DQ or data strobe signal output from the memory device 1300 while changing the DCA code. For example, DCA sweep refers to an operation of repeating a process of writing a DCA code into the memory device 1300 and detecting a data pattern in order to find a DCA code that provides a good, e.g., an optimal or maximum eye window size. The DCA sweep may be performed by receiving patterns of the data signal DQ output according to the DCA code written into the memory device 1300 by the memory controller 1100 and measuring eye window sizes of the received data patterns. Here, as the data pattern used for DCA training, a pattern such as a predetermined fixed pattern or pre-promised random data may be used.

An eye window size of two unit intervals (2-UI) of the output data signal DQ is measured for each DCA code written in the DCA sweep for the third internal clock signal IBCLK. Scores for each DCA code may be generated from the measured eye window size of the two unit intervals (2-UI). Then, DCA training of the third internal clock signal IBCLK is completed by selecting the DCA code having a maximum score. Here, scores for each DCA code may be generated with the same value. To solve or improve upon this problem, a method of selecting a good or maximum score value by linking the scores before and after the DCA code to be swept may be used. The score generation method will be described in more detail through the drawings to be described later.

In operation S130, the memory controller 1100 performs DCA training on the second and fourth internal clock signals QCLK and QBCLK. At this time, the DCA code value of the third internal clock signal IBCLK is fixed to the optimal value determined in operation S120. The memory controller 1100 measures eye window sizes of the data signals DQ corresponding to all combinations of DCA codes of the second and fourth internal clock signals QCLK and QBCLK. That is, the memory controller 1100 sweeps the DCA codes of the second and fourth internal clock signals QCLK and QBCLK. The memory controller 1100 writes the DCA code of each of the second and fourth internal clock signals QCLK and QBCLK while varying from a '−7' step to a '+7' step, and measures the eye window size of the data signal DQ at every step. For example, the DCA sweep is performed for all combinations (255=15×15 cases) of 15 cases in the DCA code range '−7 to +7' of the second internal clock signal QCLK and 15 cases in the DCA code range '−7 to +7' of the fourth internal clock signal QBCLK.

The pattern of the data signal DQ output according to the DCA sweep of the second and fourth internal clock signals QCLK and QBCLK is received by the memory controller 1100. Then, the memory controller 1100 measures the eye window size of the data signal DQ and generates a score. In the DCA sweep of the second and fourth internal clock signals QCLK and QBCLK, the eye window size of the data signal DQ of one unit interval (1-UI) is measured. A score for each DCA code combination may be generated from the measured eye window size of one unit interval (1-UI).

DCA codes of the second and fourth internal clock signals QCLK and QBCLK may be determined by selecting the DCA code having or based on a maximum score for each DCA code combination. Here, the same score may be generated among each DCA code combination. In this case, for more accurate DCA code selection, the score may be calculated by summing eye window sizes adjacent to the top, bottom and left and right sides of the two-dimensional array of DCA code combinations. And, among the summed score values, a DCA code combination corresponding to or based on the maximum score value may be selected as an optimal or good DCA code combination of the second and fourth internal clock signals QCLK and QBCLK. When the optimal or good DCA code combination is determined, the memory controller 1100 writes the selected DCA codes of the second and fourth internal clock signals QCLK and QBCLK into the memory device 1300.

In the above, the DCA training method for internal clock signals according to some example embodiments has been described. First, an optimal or good DCA code is selected through sweeping of the DCA code of the third internal clock signal IBCLK. Subsequently, an optimal or good DCA code combination may be selected by performing a DCA sweep of the second and fourth internal clock signals QCLK and QBCLK. When calculating a score for selecting a DCA code, a method of summing values before and after a corresponding step or top and bottom and left and right values of a two-dimensional array may be used. Through this, it may be possible to increase the accuracy of adjustment for each DCA code or for each DCA code combination.

Figure 5:
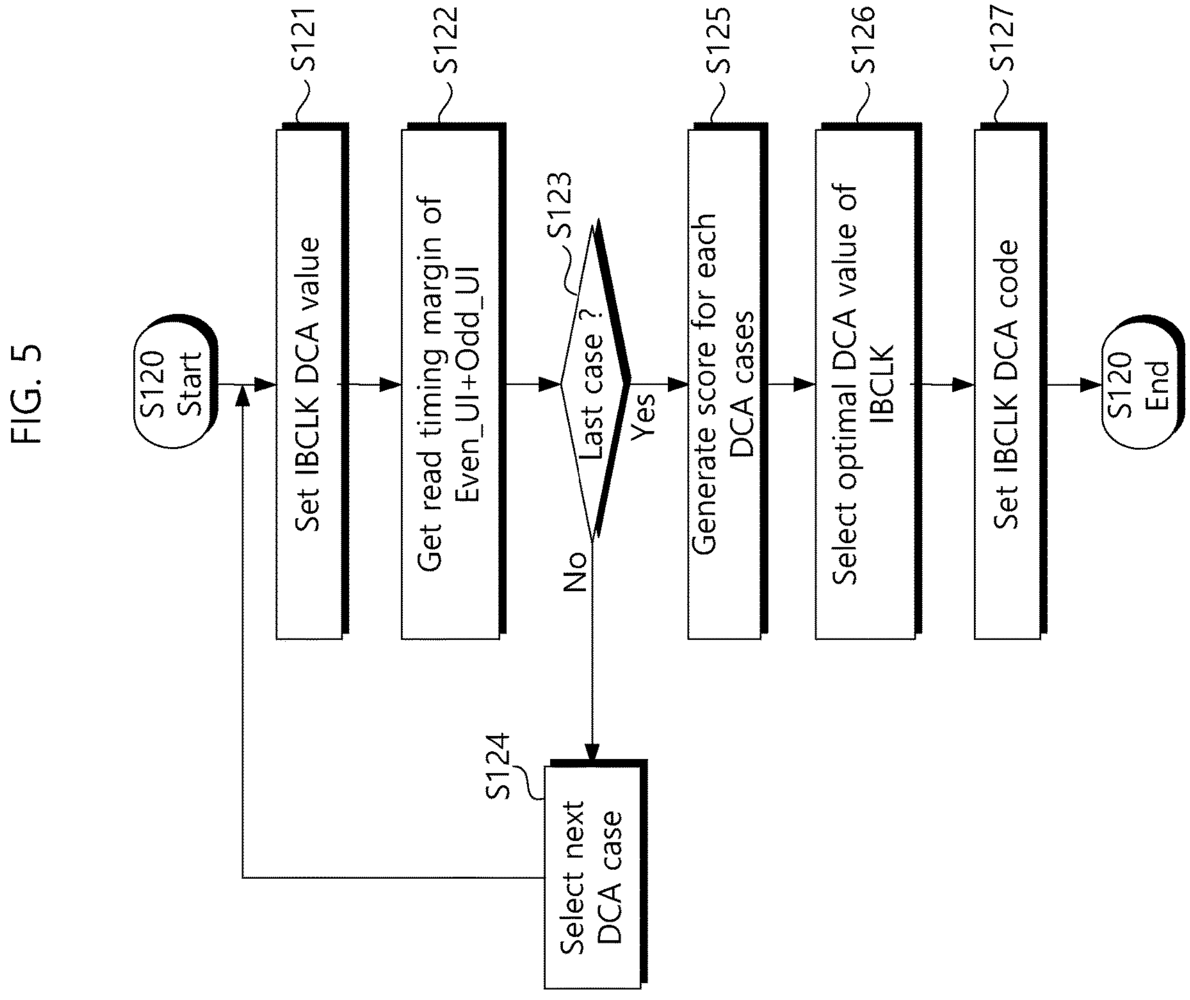
FIG. 5 is a flowchart showing operation S120 of FIG. 3 in more detail.

FIG. 5 is a flowchart showing operation S120 of FIG. 3 in more detail. Referring to FIG. 5, in operation S120, the memory controller 1100 (see FIG. 1) determines the DCA code of the third internal clock signal IBCLK by performing DCA training.

In operation S121, the memory controller 1100 writes the DCA code of the third internal clock signal IBCLK into the DCA code register 1345 (see FIG. 2) of the memory device 1300 (see FIG. 2). For DCA sweep of the third internal clock signal IBCLK, the DCA code of the third internal clock signal IBCLK must be changed while the DCA codes of the remaining internal clock signals QCLK and QBCLK are fixed to default values or '0' steps. For example, the memory controller 1100 may initially write the DCA code of the third internal clock signal IBCLK in steps of '−7' and then measure the size of the eye window of the output data signal DQ. In addition, while performing the DCA sweep loops S121, S122, S123, and S124, the memory controller 1100 may gradually increase the DCA code of the third internal clock signal IBCLK up to '+7' steps. Alternatively or additionally in some example embodiments, it will be well understood that the DCA code may be gradually decreased from a '+7' step to a '−7' step for a DCA sweep of the third internal clock signal IBCLK.

In operation S122, the memory controller 1100 measures the eye window size or timing margin of the output data signal DQ according to the DCA code value of the third internal clock signal IBCLK written in operation S121. At this time, the memory controller 1100 measures the size of the eye window of the outputted data signal DQ in units of two UIs. For example, the sum of the eye window sizes of the even-numbered unit interval (Even_UI) and the odd-numbered unit interval (Odd_UI) of the data signal DQ can be measured.

In operation S123, the memory controller 1100 determines whether the DCA code of the third internal clock signal IBCLK written in operation S121 is the final case for code sweep. For example, the memory controller 1100 determines whether all DCA sweeps for the DCA codes of the third internal clock signal IBCLK have been completed. If the DCA code of the third internal clock signal IBCLK written in operation S121 is determined to be the final case ('Yes' direction), the procedure moves to operation S125. On the other hand, if the DCA code of the third internal clock signal BCLK written in operation S121 is determined to note be the final case ('No' direction), the procedure moves to operation S124.

In operation S124, the memory controller 1100 selects a DCA code of an increased or decreased step from the DCA code of the third internal clock signal IBCLK written in operation S121. For example, if the DCA code is selected at step '−7' in operation S121, the memory controller 1100 may select the DCA code of the third internal clock signal IBCLK at step '−6' for the subsequent DCA sweep. When selection of DCA codes for subsequent DCA sweeps is completed, the procedure returns to operation S121. And the DCA sweep loop (S121, S122, S123, S124) will be repeated until all DCA cases are completed.

In operation S125, the memory controller 1100 generates a score for each DCA code written in the DCA sweep loop (S121, S122, S123, and S124). That is, a score corresponding to the eye window size of the data signal is generated for each 15 cases from the '−7' step to the '+7' step of the DCA code of the third internal clock signal IBCLK. At this time, the eye window size is the size of two unit intervals (2-UI). The eye window size may be measured in terms of or based on one or more of the vertical length, horizontal length, area, or combination of the eye windows. In particular, even when the scores for each DCA code are equal, a combination score obtained by adding the score of the corresponding DCA code and the scores of the DCA codes positioned before and after may be used to increase discernment. For example, the combination score of the DCA code '2' step may be determined as a sum of the scores of the DCA code '1' step, the DCA code '2' step, and the DCA code '3' step.

In operation S126, the memory controller 1100 selects the optimal or good DCA code of the third internal clock signal IBCLK according to the determined score or combination score. For example, the memory controller 1100 may select a DCA code that provides or that is based upon the maximum score among the determined scores or combination scores as a good or the optimal or good DCA code of the third internal clock signal IBCLK.

In operation S127, the memory controller 1100 writes the DCA code of the selected third internal clock signal IBCLK to the DCA code register 1345 of the memory device 1300.

In the above, detailed procedures of operation S120 for selecting the optimal or good DCA code of the third internal clock signal IBCLK have been exemplarily described. However, it will be well understood that the procedures for selecting the good or optimal DCA code of the third internal clock signal IBCLK are not limited to the described sequence and can be changed in various ways.

Figure 6:
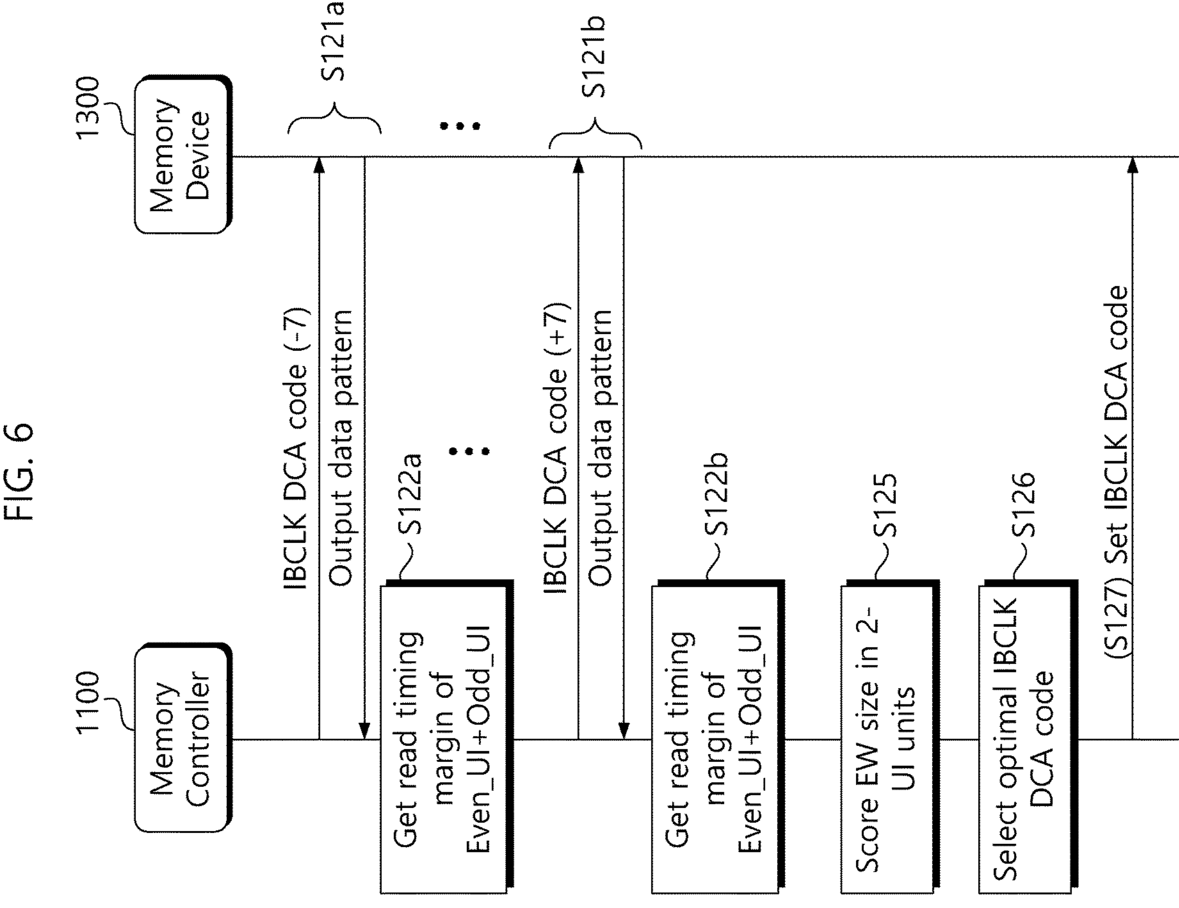
FIG. 6 is a diagram illustrating an operation occurring between a memory controller and a memory device in a process of selecting an optimal or good DCA code of a third internal clock signal IBCLK.

FIG. 6 is a diagram illustrating an operation occurring between a memory controller and a memory device in a process of selecting a good or optimal DCA code of a third internal clock signal IBCLK. Referring to FIG. 6, the memory controller 1100 measures the eye window size of the two unit intervals UI of the data signal DQ through DCA sweep. Then, an optimal or good DCA code may be selected by converting the measured two-eye window size into a score.

First, the memory controller 1100 writes the DCA code '−7' step of the third internal clock signal IBCLK into the DCA code register 1345 of the memory device 1300 in operation S121*a*. At this time, the DCA codes of the second and fourth internal clock signals QCLK and QBCLK may maintain their initial values without change. Then, the memory device 1300 adjusts the duty cycle of the third internal clock signal IBCLK corresponding to the DCA code '−7' step, and transmits the corresponding data pattern to the data signal DQ to the memory controller 1100.

In operation S122*a*, the memory controller 1100 measures the eye window size or timing margin of the outputted data signal DQ according to the setting of the DCA code '−7' step. At this time, the memory controller 1100 measures the size of the eye window of the outputted data signal DQ in units of two UIs. That is, the sum of the eye window sizes of the even-numbered unit interval Even_UI and the odd-numbered unit interval Odd_UI of the data signal DQ can be measured. The measured eye window size in units of two unit intervals 2-UI is stored in a separately provided memory. This completes the first DCA sweep loop, which performs writing of the DCA code and measurement of the eye window size.

Subsequently, a second DCA sweep loop that writes DCA code '−6' steps and measures the eye window size of the data signal, and a third DCA sweep loop that writes DCA code '−5' steps and measures the eye window size of the data signal will proceed sequentially. In this way, it proceeds to the 15th DCA sweep loop indicated by operation S121*b*. In the 15th DCA sweep loop, the DCA code '+7' step is written into the memory device 1300, and a data signal DQ corresponding thereto is output. Then, in operation S122*b*, the memory controller 1100 measures the eye window size or timing margin of the outputted data signal DQ according to the setting of the DCA code '+7' step. At this time, the memory controller 1100 measures the size of the eye window of the outputted data signal DQ in units of two UIs. The measured eye window size in units of two unit intervals 2-UI is stored in a separately provided memory. This completes the 15th DCA sweep loop which performs writing of the DCA code and measurement of the eye window size.

The memory controller 1100 generates scores for each DCA code of the data signal DQ measured in the first to fifteenth DCA sweep loops in operation S125. That is, scores are given according to the eye window size of the data signal for each 15 cases from the DCA '−7' step to the '+7' step of the third internal clock signal IBCLK. In this case, the eye window size is a value measured in units of two unit intervals 2-UI. In particular, even if the scores for each DCA code are equal, a combination score obtained by adding the score of the corresponding DCA code and the scores of DCA codes located before and after the DCA code to increase discrimination may be used.

In operation S126, the memory controller 1100 selects the optimal or good DCA code of the third internal clock signal IBCLK according to the determined score or combination score. For example, the memory controller 1100 may select a DCA code that provides the maximum score among the determined scores or combination scores as the optimal or good DCA code of the third internal clock signal IBCLK.

In operation S127, the memory controller 1100 writes the DCA code of the selected third internal clock signal IBCLK to the DCA code register 1345 of the memory device 1300.

Figure 7:
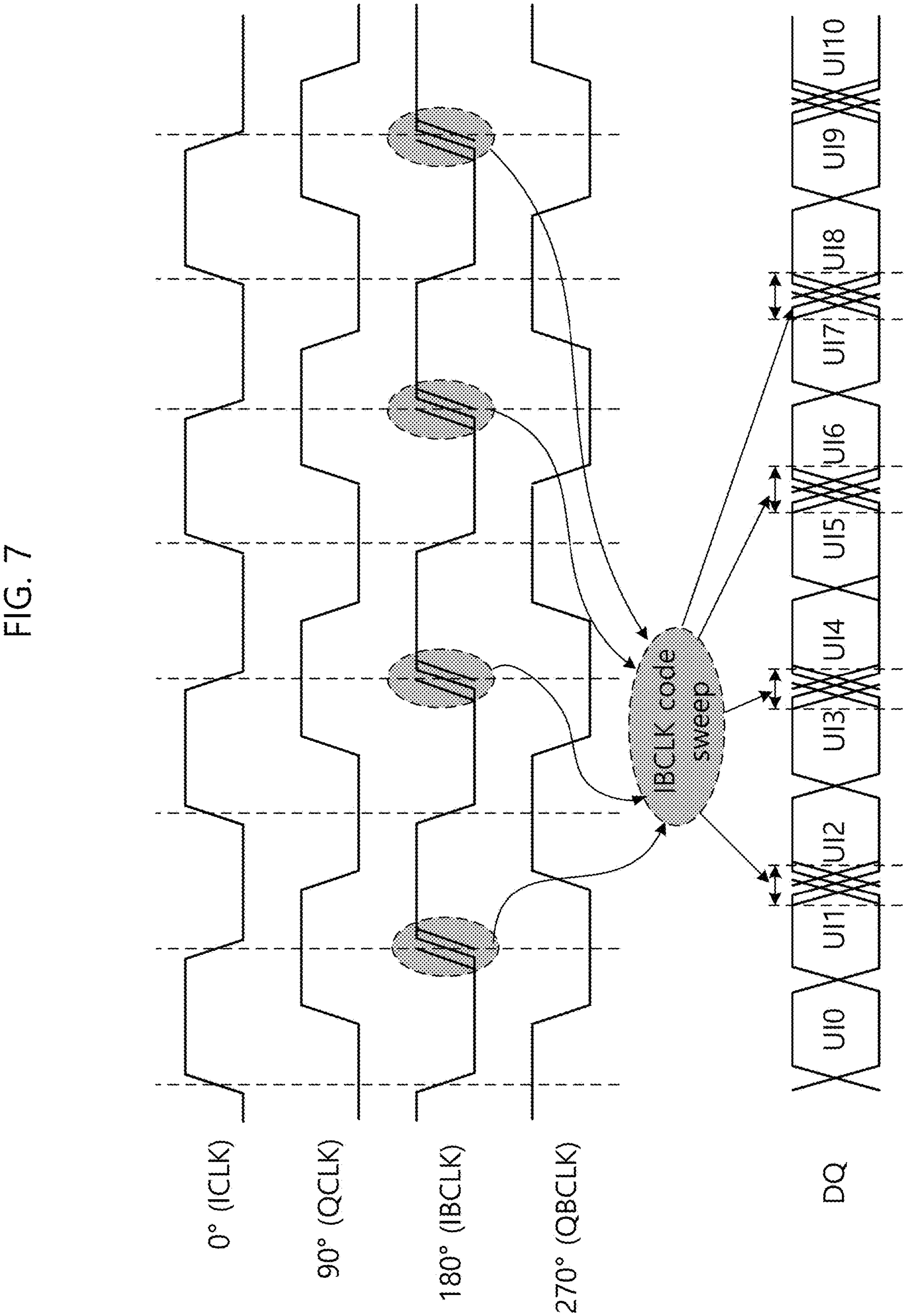
FIG. 7 is a timing diagram exemplarily illustrating a change in the data signal DQ according to the adjustment of the third internal clock signal IBCLK according to some example embodiments.

FIG. 7 is a timing diagram exemplarily illustrating a change in the data signal DQ according to the adjustment of the third internal clock signal IBCLK according to some example embodiments. Referring to FIG. 7, when the duty cycle of the third internal clock signal IBCLK is adjusted by changing the DCA code, the duty cycle between two unit intervals 2-UI of the data signal DQ is adjusted.

For the DCA sweep of the third internal clock signal IBCLK, the DCA codes of the remaining internal clock signals QCLK and QBCLK are fixed to default value or DCA '0' step. The memory controller 1100 measures the eye window size of the data signal DQ while sequentially changing the DCA code of the third internal clock signal IBCLK. As described above, the memory controller 1100 may gradually increase the DCA code of the third internal clock signal IBCLK from a '−7' step to a '+7' step. It is also possible to reduce the writing order of DCA codes from a '+7' step to a '−7' step. The order of writing DCA codes is not limited to the disclosure of the present invention.

As the DCA code is adjusted, the rising edge portion of the third internal clock signal IBCLK of 180° phase advances or retreats. Then, the unit of the data signal DQ to which the third internal clock signal IBCLK has an effect may increase or decrease in size of the unit interval UI. That is, assuming that the data pattern output through the data signal DQ is output from the unit interval UI0, the size change of the eye window may cause the boundaries of the unit intervals UI1 and UI2 to move forward or backward. Similarly, the boundaries of the unit intervals UI3 and UI4, the boundaries of the unit intervals UI5 and UI6, the boundaries of the unit intervals UI7 and UI8, and the boundaries of the unit intervals UI9 and UI10 may advance or retreat.

Figure 8:
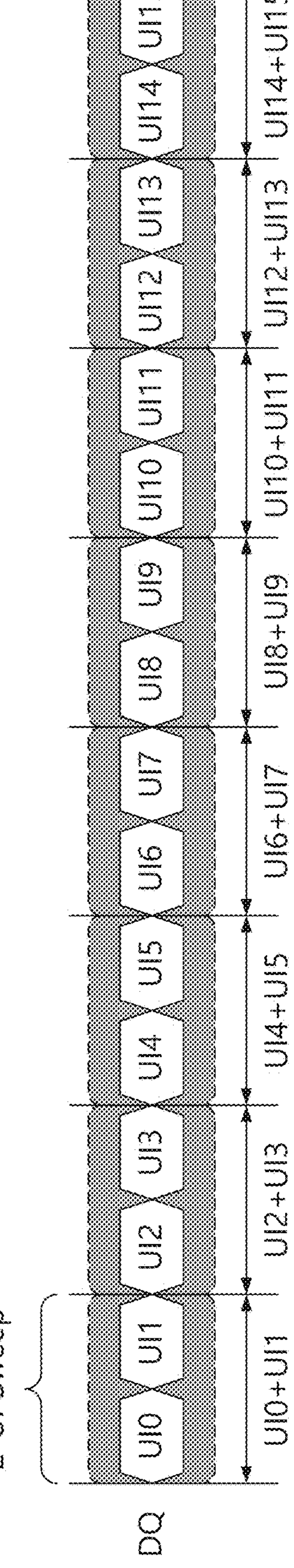
FIG. 8 is a diagram showing a method of measuring an eye window size according to a DCA sweep of a third internal clock signal IBCLK according to various example embodiments.

FIG. 8 is a diagram showing a method of measuring an eye window size according to a DCA sweep of a third internal clock signal IBCLK according to various example embodiments. Referring to FIG. 8, the memory controller 1100 changes the DCA code of the third internal clock signal IBCLK of the memory device 1300, and measures the size of two unit intervals 2-UI of the eye window of the output data signal DQ.

A data pattern output through the data signal DQ according to the DCA code written for the DCA sweep of the third internal clock signal IBCLK may be output from the unit interval UI0. The memory controller 1100 receives output data patterns and measures eye window sizes of the received data patterns. At this time, as the data pattern, a predetermined fixed pattern may be used or pre-promised random data may be used.

In the DCA sweep of the third internal clock signal IBCLK, the eye window size of the two unit intervals 2-UI of the output data signal DQ is measured for each input DCA code. Scores for each DCA code may be generated from the measured eye window size of the two unit intervals 2-UI. A method of generating a score will be described with reference to FIG. 9 to be described later. The two unit intervals in which the eye window size is measured are, for example, 'U10+UI1', 'UI2+UI3', 'UI4+UI5', 'UI6+UI7', 'UI8+UI9', 'UI10+UI11','UI12+UI13', 'UI14+UI15'. Eye window size values of a plurality of two unit intervals 2-UI are changed to average or other representative values and stored as eye window size values for the corresponding DCA code.

Figure 9:
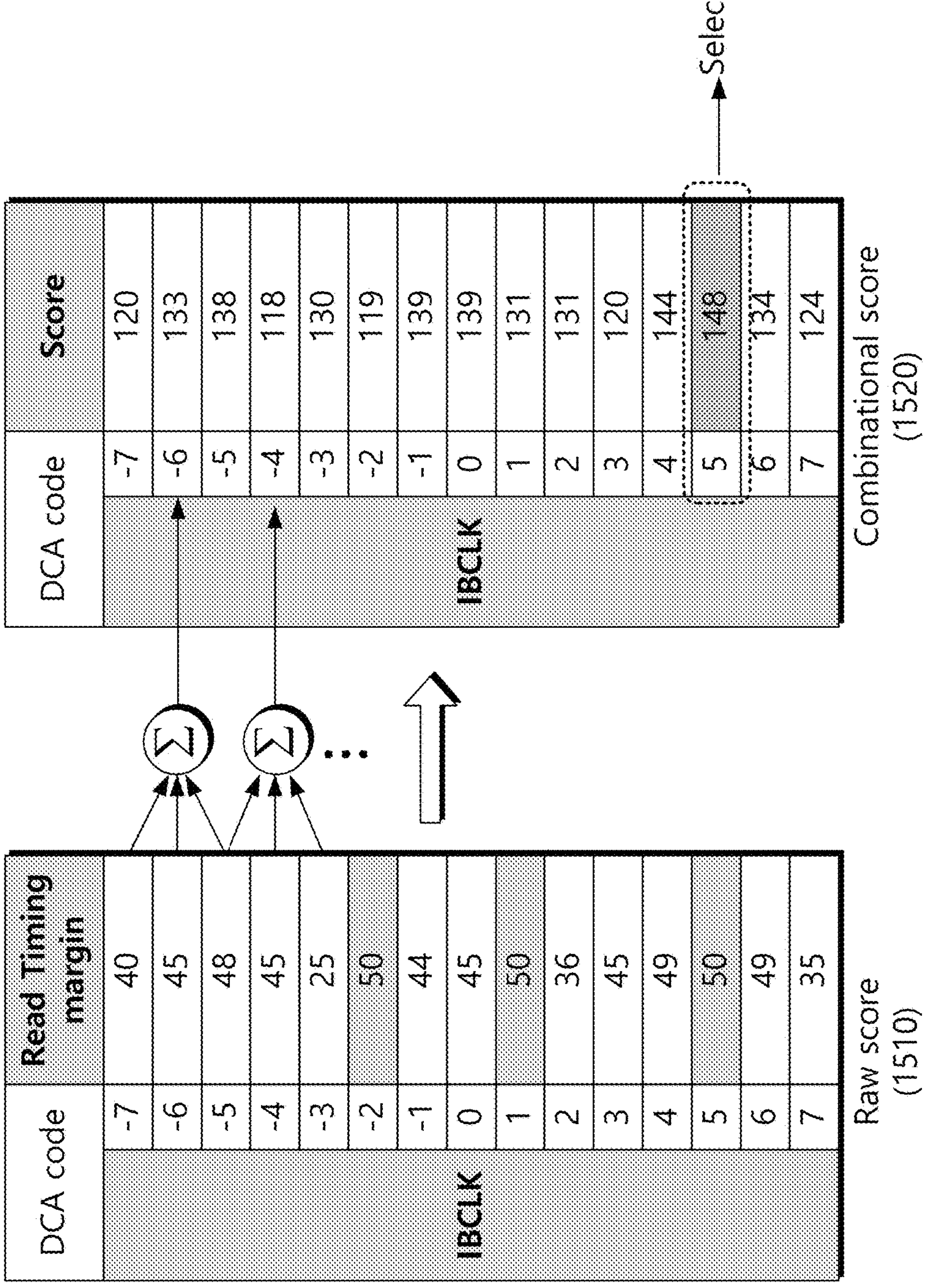
FIG. 9 is a diagram showing an example of a method of generating a score for each DCA code according to a DCA sweep of a third internal clock signal IBCLK.

FIG. 9 is a diagram showing an example of a method of generating a score for each DCA code according to a DCA sweep of a third internal clock signal IBCLK. Referring to FIG. 9, the memory controller 1100 changes the DCA code of the third internal clock signal IBCLK of the memory device 1300, and measures the size of two unit intervals 2-UI of the eye window of the output data signal DQ.

When the size of the eye window of the two unit intervals of the output data signal DQ is measured, a raw score 1510 for each DCA code is generated. In the raw score 1510, the window size for each DCA code may have the same value. That is, the maximum value should be selected from the generated score, but a tie may exist in the raw score 1510. That is, in the raw score 1510, the DCA codes −2, 1, and 5 may each have the same score of '50'. Even in this case, as a technique for selecting an optimal or good DCA code, the combination score 1250 can be generated in the present invention.

The combinational score 1520 is generated by summing three consecutive scores in the raw score 1510. For example, the combinational score 1520 of the DCA code '−6' can be obtained by adding the values of the raw scores 1510 of the DCA codes −7, −6, and −5. Alternatively or additionally, the combination score 1520 of the DCA code '−7' located at the edge can be obtained by adding the raw score 1510 values of the DCA codes 7, −7, and −6. The combinational score 1520 of the DCA code '−4' may be obtained by adding the values of the raw score 1510 of the DCA codes −5, −4, and −3. When the combinational score 1520 for each DCA code is calculated in this way, in the raw score 1510, scores with the same score appear as different values according to the scores of neighboring DCA codes. That is, when the combination score 1520 is calculated, the DCA code '5' appears as a combination score value of '148'. Accordingly, the DCA code of the third internal clock signal IBCLK may be selected as '5'.

Figure 10:
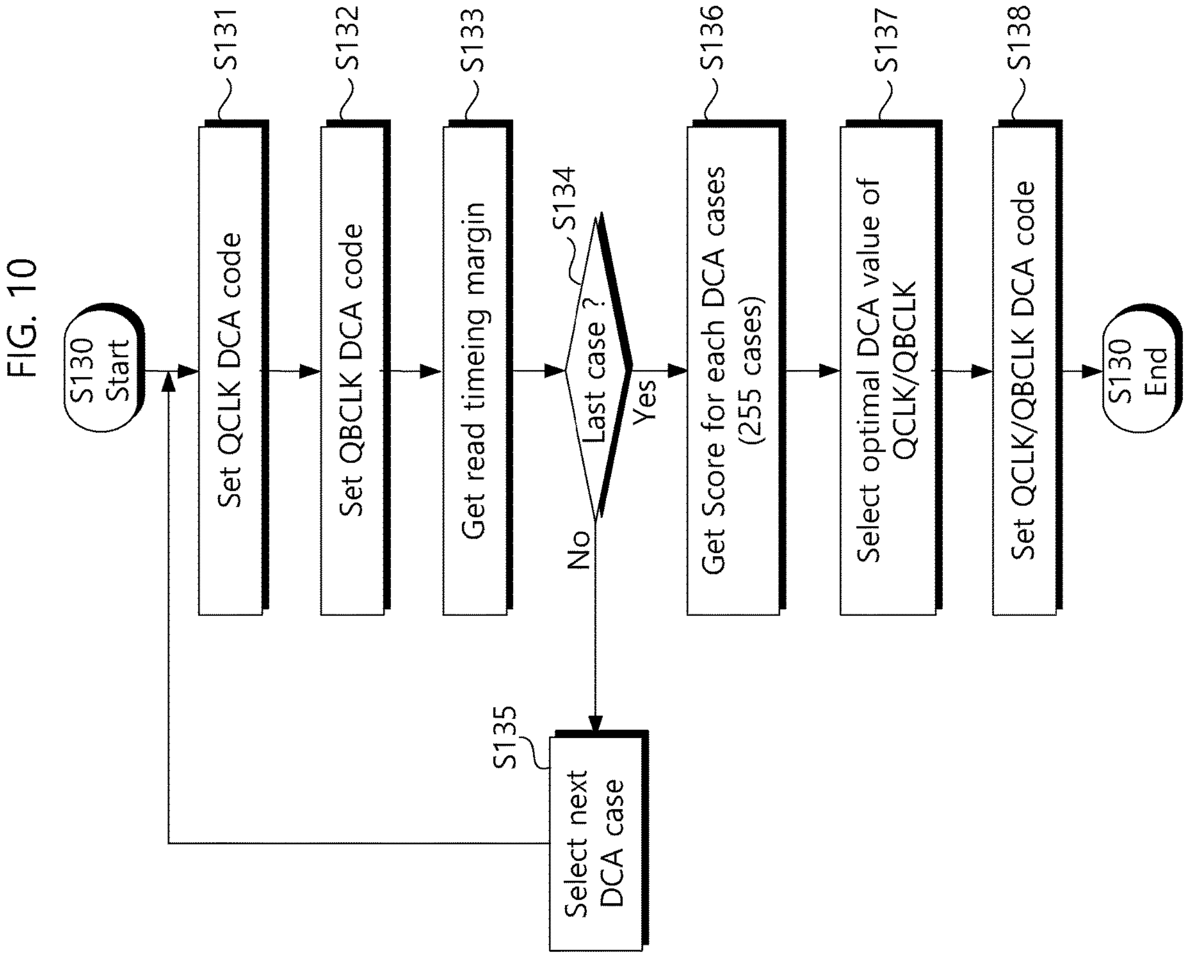
FIG. 10 is a flowchart showing operation S130 of FIG. 3 in more detail.

FIG. 10 is a flowchart showing operation S130 of FIG. 4 in more detail. Referring to FIG. 10, in operation S130, the memory controller 1100 (see FIG. 1) performs DCA training to determine DCA codes of the second and fourth internal clock signals QCLK and QBCLK.

In operation S131, the memory controller 1100 writes the DCA code of the second internal clock signal QCLK into the DCA code register 1345 (see FIG. 2) of the memory device 1300 (see FIG. 2). For example, the DCA code of the second internal clock signal QCLK may be written into the mode register set MRS using a per-DRAM addressability PDA mode. At this time, the DCA code of the third internal clock signal IBCLK is already set to an optimal value.

In operation S132, the memory controller 1100 writes the DCA code of the fourth internal clock signal QBCLK into the DCA code register 1345 of the memory device 1300. Similarly, by activating the PDA mode, the DCA code of the fourth internal clock signal QBCLK can be written to the mode register set MRS. Through steps S131 and S132, one combination of the DCA code of the second internal clock signal QCLK and the DCA code of the fourth internal clock signal QBCLK is input. For example, at the time of initial input, the DCA code '−7' step of the second internal clock signal QCLK and the DCA code '−7' step of the fourth internal clock signal QBCLK may be input. The selection of this combination will repeat the DCA sweep loop (S131, S132, S133, S134, S135) until reaching the DCA code '7' step of the second internal clock signal QCLK and the DCA code '7' step of the fourth internal clock signal QBCLK. In addition, it has been described that the DCA code of the second internal clock signal QCLK and the DCA code of the fourth internal clock signal QBCLK are sequentially written through steps S131 and S132, but the present invention is not limited thereto. The DCA codes of the second internal clock signal QCLK and the fourth internal clock signal QBCLK may be written in an opposite order or simultaneously.

In operation S133, the memory controller 1100 measures the eye window size or timing margin of the output data signal DQ according to the DCA codes written in steps S131 and S132. At this time, the memory controller 1100 measures the size of the eye window of the output data signal DQ in units of one UI.

In operation S134, the memory controller 1100 determines whether the DCA codes of the second internal clock signal QCLK and the fourth internal clock signal QBCLK written in steps S131 and S132 are final cases. That is, the memory controller 1100 determines whether the DCA sweep of all cases of the DCA codes of the second internal clock signal QCLK and the DCA codes of the fourth internal clock signal QBCLK has been completed. If the DCA codes written in steps S131 and S132 are determined to be the final case ('Yes' direction), the procedure moves to operation S136. On the other hand, if it is determined that the DCA codes of the second internal clock signal QCLK and the fourth internal clock signal QBCLK written in steps S131 and S132 are not final cases ('No' direction), the procedure moves to operation S135.

In operation S135, the memory controller 1100 changes the combination written in steps S131 and S132. For example, assume that the DCA code '−7' step of the second internal clock signal QCLK and the DCA code '−7' step of the fourth internal clock signal QBCLK are input in the previous loop. Then, the memory controller 1100 may change the DCA code of the second internal clock signal QCLK to a '−6' step and the DCA code of the fourth internal clock signal QBCLK to a '−7' step in the next loop. A method of selecting a DCA code combination is not limited to the above method. However, all DCA code cases of the second and fourth internal clock signals QCLK and QBCLK should be input through the DCA sweep loop (S131, S132, S133, S134, S135). When selection of DCA codes for the subsequent DCA sweep is completed, the procedure returns to operation S131. And the DCA sweep loop (S131, S132, S133, S134, S135) will be repeated until all DCA cases are completed.

In operation S136, the memory controller 1100 generates a score for each DCA code combination written in the DCA sweep loops. That is, a score representing the quality of the data signal DQ is generated for each of 225(15×15) cases from the DCA code combination (−7, −7) of the second and fourth internal clock signals (QCLK, QBCLK) to the last combination (+7, +7). That is, the eye window size of the data signal DQ is measured for each DCA code combinations. In this case, the eye window size is the size of single unit interval UI. The eye window size may be measured in terms of the vertical, horizontal, area, or combination of the eye windows.

In particular, according to the scoring method of the present invention, even if the scores for each DCA code combination are equal, a combination score obtained by adding the score of the corresponding DCA code and the scores of DCA codes located before, after, and on the left and right can be used to increase discrimination. A method of calculating a combination score of the second and fourth internal clock signals QCLK and QBCLK will be described in more detail with reference to the drawings to be described later.

In operation S137, the memory controller 1100 selects the optimal or good DCA codes of the second and fourth internal clock signals QCLK and QBCLK according to the determined score or combination score. For example, the memory controller 1100 may select a DCA code that provides the maximum score among the determined scores or combination scores as the optimal or good DCA code of the second and fourth internal clock signals QCLK and QBCLK.

In operation S138, the memory controller 1100 writes DCA codes of the selected second and fourth internal clock signals QCLK and QBCLK to the DCA code register 1345 of the memory device 1300.

In the above, detailed procedures of operation S130 for selecting the optimal or good DCA code of the second and fourth internal clock signals QCLK and QBCLK have been exemplarily described. However, it will be well understood that the procedures for selecting the optimum DCA code of the second and fourth internal clock signals QCLK and QBCLK are not limited to the described order and can be changed in various ways.

Figure 11:
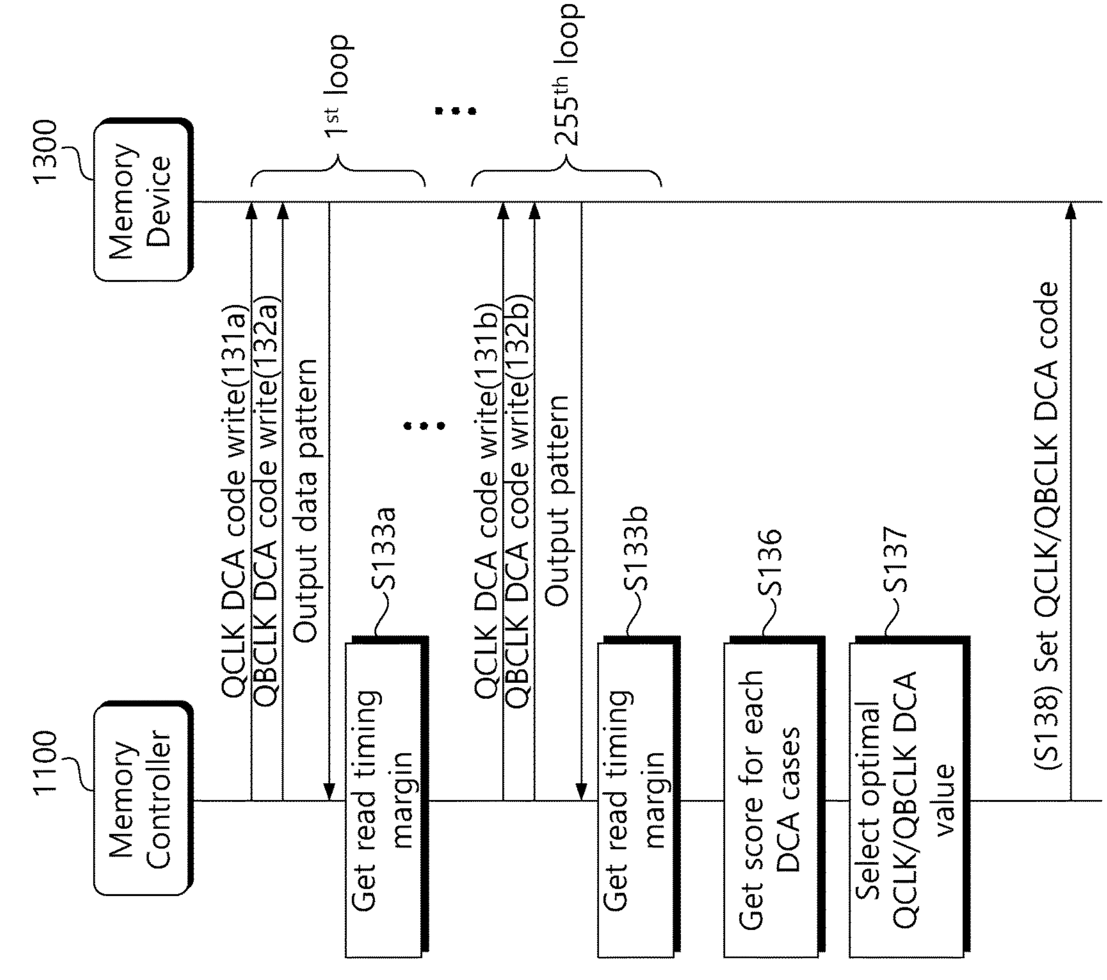
FIG. 11 is a diagram illustrating an operation occurring between a memory controller and a memory device in a process of selecting an optimal or good DCA code of second and fourth internal clock signals QCLK and QBCLK.

FIG. 11 is a diagram illustrating an operation occurring between a memory controller and a memory device in a process of selecting an optimal or good DCA code of second and fourth internal clock signals QCLK and QBCLK. Referring to FIG. 11, the memory controller 1100 measures the eye window size of the data signal DQ through DCA sweep. In addition, the optimal or good DCA code combination of the second and fourth internal clock signals QCLK and QBCLK may be selected by converting the measured eye window size into a score.

First, the memory controller 1100 writes the DCA code '−7' step of the second internal clock signal QCLK into the DCA code register 1345 of the memory device 1300 in operation S131*a*. At this time, the DCA code of the third internal clock signal IBCLK is already set to an optimal value. In operation S132*a*, the DCA code '−7' step of the fourth internal clock signal QBCLK is written into the DCA code register 1345 of the memory device 1300. Then, the memory device 1300 transmits the data signal DQ having a characteristic corresponding to the DCA code combination (−7, −7) of the second and fourth internal clock signals QCLK and QBCLK to the memory controller 1100.

In operation S133*a*, the memory controller 1100 measures the eye window size or timing margin of the output data signal DQ according to the DCA code combination (−7, −7) of the second and fourth internal clock signals QCLK and QBCLK. At this time, the memory controller 1100 measures the size of the eye window of the output data signal DQ in units of one UI. The measured eye window size is stored in a separately provided memory. Then, the first loop of writing the DCA code and measuring the eye window size is completed.

Subsequently, the memory controller 1100 will perform a second loop of writing the DCA code combination (−6, −7) of the second and fourth internal clock signals QCLK, QBCLK and measuring the eye window size of the data signal DQ. And a third loop of writing the DCA code combination (−5, −7) of the second and fourth internal clock signals QCLK, QBCLK and measuring the eye window size of the data signal DQ will be performed. If the 255th loop is performed in this way, the measurement of the eye window size corresponding to the DCA code combinations 7 and 7 of the second and fourth internal clock signals QCLK, QBCLK will be completed.

The memory controller 1100 generates scores for each DCA code combination of the data signal DQ measured in the first loop to the 255th loop in operation S136. That is, the memory controller 1100 generates scores for each of 255 cases corresponding to DCA code combinations of the second and fourth internal clock signals QCLK and QBCLK. In particular, even if the scores for each DCA code combination are equal, a combination score obtained by adding the score of the corresponding DCA code and the scores of DCA codes positioned before, after, and on the left and right may be used to increase discrimination.

In operation S137, the memory controller 1100 selects the optimal or good DCA code combination of the second and fourth internal clock signals QCLK and QBCLK according to the determined score or combination score. For example, the memory controller 1100 may select a DCA code combination that provides the maximum score among the determined scores or combination scores as the optimal or good DCA code of the second and fourth internal clock signals QCLK and QBCLK.

In operation S138, the memory controller 1100 writes DCA codes of the selected second and fourth internal clock signals QCLK and QBCLK into the DCA code register 1345 of the memory device 1300.

Figure 12:
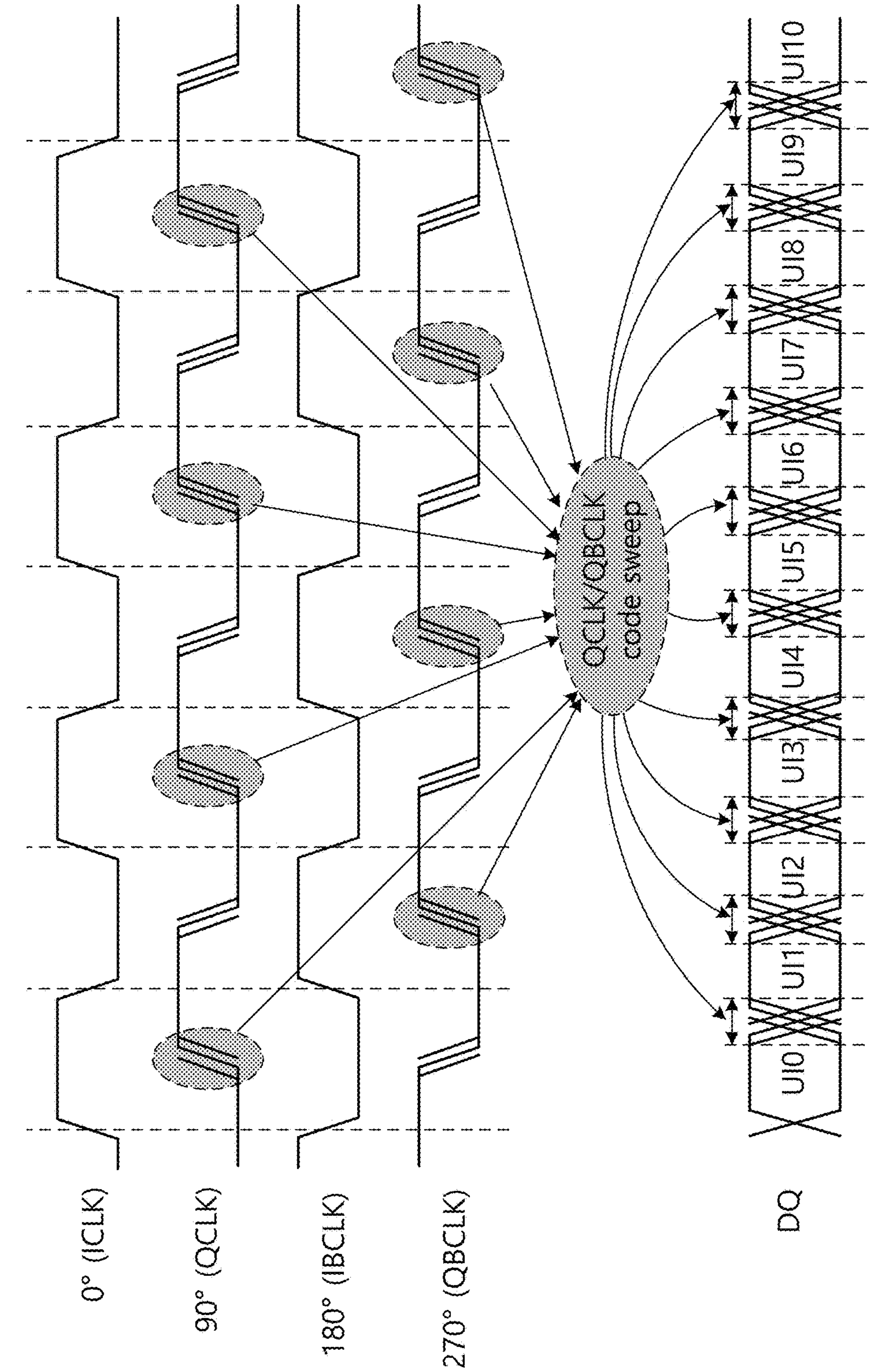
FIG. 12 is a timing diagram exemplarily illustrating a change in the data signal DQ according to adjustment of the second and fourth internal clock signals QCLK and QBCLK according to some example embodiments.

FIG. 12 is a timing diagram exemplarily illustrating a change in the data signal DQ according to adjustment of the second and fourth internal clock signals QCLK and QBCLK according to some example embodiments. Referring to FIG. 12, when the duty cycles of the second and fourth internal clock signals QCLK and QBCLK are adjusted by changing the DCA code, the even and odd duty cycles of the data signal DQ are adjusted.

For the DCA sweep of the second and fourth internal clock signals QCLK and QBCLK, the DCA code of the third internal clock signal IBCLK is fixed to the optimal set value selected in the previous step. The memory controller 1100 measures the eye window size of the data signal DQ while sequentially changing the DCA code combination of the second and fourth internal clock signals QCLK and QBCLK. As described above, the memory controller 1100 may gradually increase the 255 DCA code combinations of the second and fourth internal clock signals QCLK and QBCLK from (−7, −7) to (+7, +7). At this time, the selection order of the DCA code combinations may be selected in various ways.

As the DCA code combination is adjusted, the rising edge portion of each of the second and fourth internal clock signals QCLK and QBCLK with phases of 90° and 180° advances or retreats. Then, the size of the unit interval UI of the data signal DQ may increase or decrease according to the duty cycle change of the second and fourth internal clock signals QCLK and QBCLK. That is, assuming that the data pattern output through the data signal DQ is output from the unit interval UI0, the size change of the eye window may advance or retreat the boundaries of all unit intervals.

FIG. 13A and FIG. 13B are tables showing a method of generating scores for each DCA code according to DCA sweep of the second and fourth internal clock signals QCLK and QBCLK. Referring to FIG. 13A and FIG. 13B, the raw score 1610 and the combination score 1620 may be used for the eye window size of the data signal DQ for each DCA code combination of the second and fourth internal clock signals QCLK and QBCLK.

Referring to FIG. 13A, the eye window size of the data signal DQ output for each DCA code combination of the second and fourth internal clock signals QCLK and QBCLK is stored as a raw score 1610. To indicate a combination of the second and fourth internal clock signals QCLK and QBCLK, the second internal clock signal QCLK may be arranged horizontally and the fourth internal clock signal QBCLK vertically. For example, the eye window size of the data signal DQ corresponding to the DCA code combination (−5, 0) of the second and fourth internal clock signals QCLK and QBCLK has a raw score 1610 value of '41'.

The highest score in the raw score 1610 is '45'. However, the score '45' is a tie score measured in multiple cases. For example, the same score of '45' was measured in the DCA code combinations (0, −1), (0, 0), and (0, 1) of the second and fourth internal clock signals QCLK and QBCLK. Therefore, it may not be easy to select an optimal or good DCA code combination in this case. An alternative to solving this problem is a combination score 1620 generated by combining neighboring scores.

Referring to FIG. 13B, the combination score 1620 of the second and fourth internal clock signals QCLK and QBCLK can be obtained by adding the raw score values of the DCA code (M, N), the upper and lower DCA codes {(M, N−1), (M, N+1)}, and the left and right DCA codes {(M−1, N), (M+1, N)}. Then, the combinational scores 1620 of DCA codes (0, −1), (0, 0), and (0, 1) that recorded a tie of '45' in the raw score 1610 are '265', '268', and '267'. Accordingly, the DCA code combination (0, 0) corresponding to the highest value of '268' of the combination score may be determined as the optimal or good DCA code of the second and fourth internal clock signals QCLK and QBCLK.

FIG. 14 is a block diagram showing a computing system 2000 according to some example embodiments. Referring to FIG. 14, a computing system 2000 may include a processor 2050, a chipset 2100, an input/output controller 2200, and a memory device 2300.

The processor 2050 executes software (application programs, operating systems, device drivers) running on the computing system 2000. The processor 2050 will execute an operating system (OS, not shown) loaded on the memory device 2300. The processor 2050 will execute various application programs to be driven based on the operating system OS.

The chipset 2100 controls the connection between the processor 2050, the memory device 2300, and the input/output controller 2200. The chipset 2100 may include a northbridge for controlling the processor 2050 and the memory device 2300 and a southbridge for controlling the input/output controller 2200; however, example embodiments are not limited thereto. For example, the chipset 2100 may be provided without distinguishing functions of the northbridge and the southbridge.

In particular, the chipset 2100 of example embodiments may adjust the duty cycles of the internal clock signals ICLK, QCLK, IBCLK, and QBCLK having four quadrature phases of the memory device 2300 by writing a DCA code. To this end, the chipset 2100 includes a memory controller 2150 that performs DCA training. The memory controller 2150 determines the DCA code by performing training on the internal clock signal IBCLK in the first training sequence. At this time, the eye window size is measured in units of two unit intervals UI of the data signal DQ output from the memory device 2300. In addition, the eye window size measured for each DCA code may be generated as a combination score that is added to the front and rear eye window sizes. The memory controller 2150 sets the memory device 2300 by selecting the maximum value of the combination score. In a state where the determined DCA code for the internal clock signal IBCLK is set, the memory controller 2150 performs a second training sequence for determining the DCA code of the internal clock signals QCLK and QBCLK. At this time, the memory controller 2150 measures the eye window size in units of one unit interval UI of the data signal to generate a score. Similarly, when the DCA codes of the internal clock signals QCLK and QBCLK are arranged in the row and column directions, the score may be generated by combining eye window sizes of adjacent cases in the row and column directions. Here, it will be understood that the function of the chipset 2150 or the function or configuration of the memory controller 2150 may be integrated into the processor 2050.

I/O controller 2200 controls data flow between processor 2050 and one or more input/output interfaces (e.g., wired and wireless network interfaces) and I/O devices. For example, the input/output controller 2200 may control data flow between the processor 2050 and at least one of a keyboard, mouse, track ball, pen, touch screen, display, monitor, speaker, and printer.

The memory device 2300 may operate substantially the same as the memory device 1300 of FIG. 1. For example, in the memory device 2300, the duty cycle of at least one of the internal clock signals ICLK, QCLK, IBCLK, and QBCLK may be adjusted by the DCA code, and the duty cycle of the data signal DQ or the data strobe signal DQS may be set. Since the configurations of the memory device 2300 are substantially the same as those of FIG. 1, a description of each configuration will be omitted.

Figure 15:
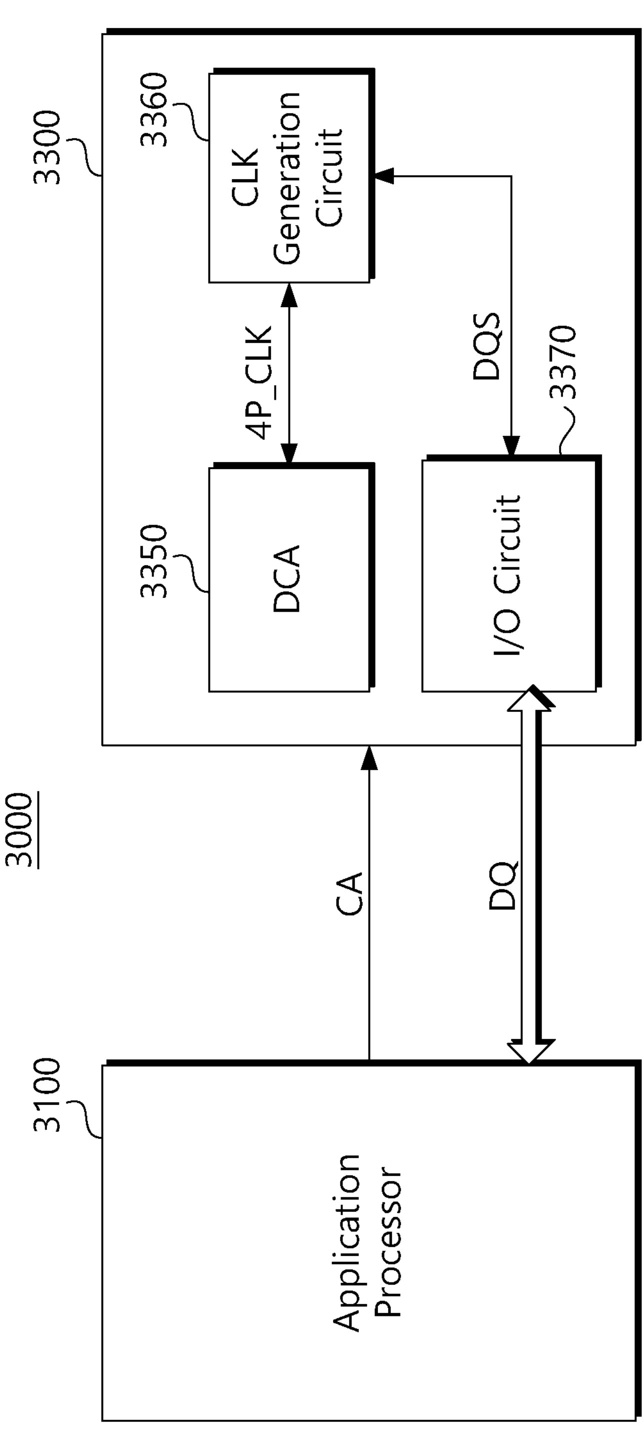
FIG. 15 is a block diagram showing a mobile system according to some example embodiments.

FIG. 15 is a block diagram showing a mobile system according to some example embodiments. Referring to FIG. 15, a computing system 2000 may include an application processor 3100 and a memory device 3300.

The application processor 3100 may adjust the duty cycle of the internal clock signals ICLK, QCLK, IBCLK, and QBCLK having four quadrature phases of the memory device 3300 by writing a DCA code. The application processor 3100 determines a DCA code by performing training on the internal clock signal IBCLK in the first training sequence. At this time, the eye window size is measured in units of two unit intervals UI of the data signal DQ output from the memory device 3300. In addition, the eye window size measured for each DCA code may be generated as a combination score that is added to the front and rear eye window sizes. The application processor 3100 sets the memory device 3300 by selecting the maximum value of the combination score. In a state where the determined DCA code for the internal clock signal IBCLK is set, the application processor 3100 performs a second training sequence for determining the DCA code of the internal clock signals QCLK and QBCLK. In this case, the application processor 3100 generates a score by measuring the eye window size in units of one unit interval UI of the data signal. Similarly, when the DCA codes of the internal clock signals QCLK and QBCLK are arranged in the row and column directions, the score may be generated by combining eye window sizes of adjacent cases in the row and column directions.

The memory device 3300 may operate substantially the same as the memory device 1300 of FIG. 1. That is, in the memory device 3300, the duty cycle of at least one of the internal clock signals ICLK, QCLK, IBCLK, and QBCLK may be adjusted by the DCA code, and the duty cycle of the data signal DQ or the data strobe signal DQS may be set. Since the configurations of the memory device 3300 are substantially the same as those of FIG. 1, a description of each configuration will be omitted. In this embodiment, the memory device 3300 may be implemented as a Low Power DDR (LPDDR) memory optimized for a mobile environment.

Figure 16:
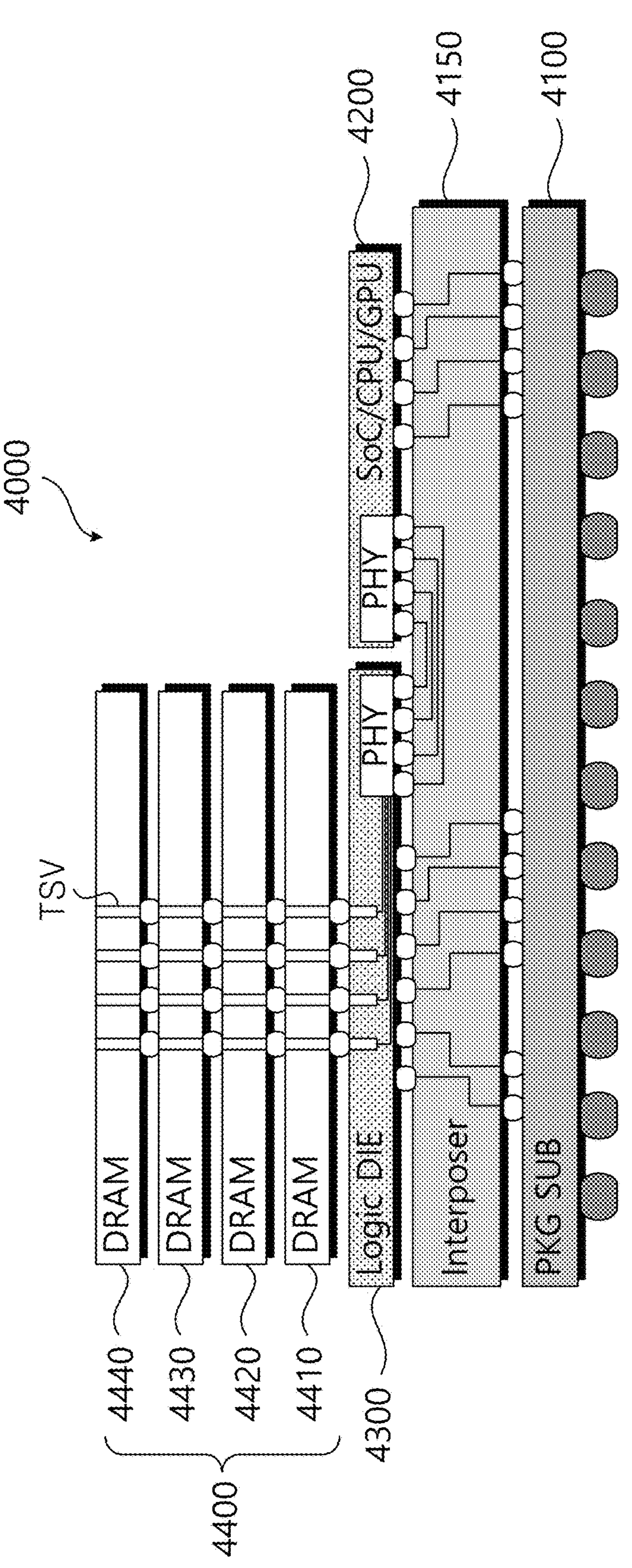
FIG. 16 is a cross-sectional view of a memory system according to some example embodiments.

FIG. 16 is a cross-sectional view of a memory system according to some example embodiments. Referring to FIG. 16, a memory system 4000 implemented as a stacked semiconductor device may include a PCB substrate 4100, an interposer 4150, a processor 4200, a logic die 4300, and a high-bandwidth memory 4400 including a plurality of DRAM dies 4410, 4420, 4430, and 4440.

The memory system 4000 connects the high-bandwidth memory 4400 and the processor 4200 using an interposer 4150. The interposer 4150 is disposed on the package substrate 4100 and is electrically connected to the package substrate 4100 through flip chip bumps FB. The interposer 4150 may connect the logic die 4300 and the processor 4200. The interposer 4150 may connect between the physical layer 4350 of the logic die 4300 and the physical layer 4250 of the processor 4200 and provide physical paths formed using conductive materials. Accordingly, the logic die 4300 and the processor 4200 may transmit and receive signals to each other through the interposer 4150.

A processor 4200, a logic die 4300, and stacked DRAM dies 4410, 4420, 4430, and 4440 may be disposed on the interposer 4150. To implement a memory system, through-silicon via (TSV) lines are formed in the plurality of DRAM dies 4410, 4420, 4430, and 4440. The TSV lines may be electrically connected to micro bumps MB formed between the plurality of DRAM dies 4410, 4420, 4430, and 4440.

Although the high-bandwidth memory 4400 is illustrated as including four DRAM dies 4410, 4420, 4430, and 4440, the number of DRAM dies may be variously changed. For example, high-bandwidth memory 4400 configured in a stacked fashion may include 8, 12 or 16 HBM dies. The logic die 4300 and the DRAM dies 4410, 4420, 4430, and 4440 may be stacked and electrically connected to each other through silicon through electrodes (TSVs). For example, the memory system 1000 may be implemented based on HBM or HMC standards.

In some example embodiments, the processor 4200 may adjust the duty cycle of the four quadrature phase internal clock signals ICLK, QCLK, IBCLK, and QBCLK of the high-bandwidth memory 4400 by writing a DCA code. The processor 4200 determines a DCA code by performing training on the internal clock signal IBCLK in a first training sequence. At this time, the eye window size is measured in units of two unit intervals UI of the data signal DQ output from the high-bandwidth memory 4400. In addition, the eye window size measured for each DCA code may be generated as a combination score that is added to the previous and subsequent eye window sizes. The processor 4200 configures the high-bandwidth memory 4400 by selecting or selecting based on the maximum value of the combination score. In a state where the determined DCA code for the internal clock signal IBCLK is set, the processor 4200 performs a second training sequence for determining the DCA code of the internal clock signals QCLK and QBCLK. In this case, the processor 4200 measures the eye window size in units of one unit interval UI of the data signal to generate a score. Similarly, when the DCA codes of the internal clock signals QCLK and QBCLK are arranged in the row and column directions, the score may be generated by combining eye window sizes of adjacent cases in the row and column directions.

Each of the plurality of DRAM dies 4410, 4420, 4430, and 4440 may operate substantially the same as the memory device 1300 of FIG. 1. For example, the duty cycle of at least one of the internal clock signals ICLK, QCLK, IBCLK, and QBCLK of each of the plurality of DRAM dies 4410, 4420, 4430, and 4440 may be adjusted by the DCA code, and the duty cycle of the data signal DQ or the data strobe signal DQS may be set. Components of each of the plurality of DRAM dies 4410, 4420, 4430, and 4440 are substantially the same as those of FIG. 1, so a description of each component will be omitted.

Any or all of the elements described with reference to the figures may communicate with any or all other elements described with reference to figures. For example, any element may engage in one-way and/or two-way and/or broadcast communication with any or all other elements in the figures, to transfer and/or exchange and/or receive information such as but not limited to data and/or commands, in a manner such as in a serial and/or parallel manner, via a bus such as a wireless and/or a wired bus (not illustrated). The information may be in encoded various formats, such as in an analog format and/or in a digital format.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

The above are variously described example embodiments for carrying out the present invention. In addition to the above-described example embodiments, inventive may include simple design changes or easily changeable embodiments. In addition, inventive concepts will include techniques that can be easily modified and implemented using the embodiments. Therefore, the scope of inventive concepts should not be limited to the above-described example embodiments, and should be defined by the claims and equivalents of the claims of inventive concepts as well as the claims to be described later. Furthermore example embodiments are not necessarily mutually exclusive with one another. For example, some example embodiments may include one or more features described with reference to one or more figures, and may also include one or more other features described with reference to one or more other figures.

What is claimed is:

1. A training method of a memory device adjusting an eye window of a data signal in response to a duty cycle adjuster (DCA) code, comprising:

performing a first training operation that selects a first DCA code corresponding to a first internal clock signal having a phase difference of 180° relative to a reference internal clock signal; and after performing the first training operation, performing a second training operation that selects a second DCA code and a third DCA code respectively corresponding to a second internal clock signal and a third internal clock signal having a phase difference of 90° and 270° relative to the reference internal clock signal, wherein in the first training operation, an eye window size of the data signal is measured in units of two unit intervals, and in the second training operation, the eye window size of the data signal is measured in units of one unit interval.

2. The method of claim 1, wherein the first training operation comprises:

writing a code value of the first DCA code to the memory device; and in response to the code value measuring the eye window size of the data signal output from the memory device.

3. The method of claim 2, wherein the writing the code value of the first DCA code and the measuring the eye window size of the data signal are iteratively looped until applied for all cases of the code value.

4. The method of claim 3, further comprising:
generating a score for each of all of the cases after the iterative loop is complete.

5. The method of claim 4, further comprising:
generating a score corresponding to any one of the all cases by combining an eye window size measured in a previous case, an eye window size measured in a subsequent case, and the eye window size measured in the any one of the all cases.

6. The method of claim 4, further comprising:
selecting a code value corresponding to a maximum value among the scores for each of all the cases as the first DCA code.

7. The method of claim 1, wherein the second training operation comprises:
writing a combination code value of the second DCA code and the third DCA code into the memory device; and
in response to the combination code value measuring an eye window size of the data signal output from the memory device.

8. The method of claim 7, wherein the writing the combination code value of the second DCA code and the measuring an eye window size of the data signal are iteratively performed until applied to all cases of the combination code value.

9. The method of claim 8, further comprising:
generating a score for each of the all cases after the iterative loop is complete.

10. The method of claim 9, wherein in response to the DCA code of the second internal clock signal and the DCA code of the third internal clock signal being arranged in rows and columns in all cases of the combination code values, the method includes generating each score of all cases by combining eye window sizes of cases that are adjacent to each other in the row and column directions.

11. A computing system adjusting a duty cycle of four mutually orthogonal internal clock signals through a duty cycle adjuster (DCA) code, comprising:
a memory device configured to generate a data signal and/or a data strobe signal having a changed duty cycle in response to a code value of the DCA code; and
a memory controller configured to perform a first training operation that selects a first DCA code corresponding to a first internal clock signal having a phase difference of 180° relative to a reference internal clock signal, and to perform a second training operation after performing the first training operation, the second training operation selecting a second DCA code and a third DCA code respectively corresponding to a second internal clock signal and a third internal clock signal having a phase difference of 90° and 270° relative to the reference internal clock signal,
wherein memory controller is configured to generate a score by measuring an eye window size in units of two unit intervals of the data signal output from the memory device during the first training operation.

12. The system of claim 11, wherein the memory controller is configured to write a code value of the first DCA code into the memory device during the first training operation, and to measure the eye window size of the data signal output from the memory device in response to the code value to generate the score.

13. The system of claim 12, wherein the code value of the first DCA code corresponds to any one of '−7' steps to '7' steps.

14. The system of claim 13, wherein the second DCA code and the third DCA code are fixed to a default value or '0' during the first training operation.

15. The system of claim 12, wherein the memory controller is configured to combine an eye window size measured in a previous case, an eye window size measured in a subsequent case, and an eye window size measured in any one case to generate a score corresponding to any one case during the first DCA training.

16. The system of claim 12, wherein the memory controller is configured to write a combination code value of the second DCA code and the third DCA code into the memory device during the second training operation, and to measure an eye window size of the data signal output from the memory device in units of one unit interval in response to the combination code value.

17. The system of claim 16, wherein upon the DCA code value of the second internal clock signal and the DCA code value of the third internal clock signal being arranged in rows and columns in all cases of the combination code values, the memory controller generates each score of all cases by combining eye window sizes of cases that are adjacent to each other in row and column directions.

18. A training method of a memory device that adjusts a characteristic of a data signal and/or of a data strobe signal by receiving a duty cycle adjuster (DCA) code, comprising:
performing a first training of writing a test code to select a first DCA code corresponding to a first internal clock signal and selecting a code by measuring an eye window size of an output data signal; and
after performing the first training, performing a second training of writing a test combination code to select a combination code of a second DCA code and a third DCA code respectively corresponding to a second internal clock signal and a third internal clock signal and measuring an eye window size of the output data signal,
wherein in the first training, the eye window size of the data signal is measured in units of two unit intervals.

19. The method of claim 18, wherein in the first training, a score corresponding to any one case is generated by combining an eye window size measured in a previous case, an eye window size measured in a subsequent case, and the eye window size measured in the any one case.

20. The method of claim 18, wherein in the second training, upon the DCA code of the second internal clock signal and the DCA code of the third internal clock signal being arranged in rows and columns in all cases of the combination codes, the method includes generating each score of all cases by combining the eye window sizes of cases that are adjacent to each other in row and column directions.

* * * * *